(12) United States Patent
Tamura et al.

(10) Patent No.: US 11,837,487 B2
(45) Date of Patent: Dec. 5, 2023

(54) TRANSFER DEVICE, SUBSTRATE PROCESSING SYSTEM, TRANSFER METHOD AND SUBSTRATE PROCESSING METHOD

(71) Applicant: Tokyo Electron Limited, Tokyo (JP)

(72) Inventors: Takeshi Tamura, Koshi (JP); Masatoshi Kaneda, Koshi (JP); Seiji Nakano, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 905 days.

(21) Appl. No.: 16/630,063

(22) PCT Filed: Jun. 29, 2018

(86) PCT No.: PCT/JP2018/024927
§ 371 (c)(1),
(2) Date: Jan. 10, 2020

(87) PCT Pub. No.: WO2019/013022
PCT Pub. Date: Jan. 17, 2019

(65) Prior Publication Data
US 2020/0234990 A1    Jul. 23, 2020

(30) Foreign Application Priority Data

Jul. 12, 2017 (JP) .................................. 2017-136322
Jan. 19, 2018 (JP) .................................. 2018-007669

(51) Int. Cl.
*H01L 21/677* (2006.01)
*H01L 21/67* (2006.01)
(Continued)

(52) U.S. Cl.
CPC .. *H01L 21/67742* (2013.01); *H01L 21/67092* (2013.01); *H01L 21/67766* (2013.01);
(Continued)

(58) Field of Classification Search
CPC ......... H01L 21/67742; H01L 21/67092; H01L 21/67766; H01L 21/68; H01L 21/6838;
(Continued)

(56) References Cited

U.S. PATENT DOCUMENTS 8,008,129 B2 *   8/2011   Ohuchi ............... H01L 25/0657
                                                       257/E21.599

FOREIGN PATENT DOCUMENTS

JP    11345858  A   *  12/1999
JP    11345858  A      12/1999
(Continued)

OTHER PUBLICATIONS

International Search Report for PCT/JP2018/024927 dated Jul. 31, 2018, 3 pages.

*Primary Examiner* — Ermias T Woldegeorgis
(74) *Attorney, Agent, or Firm* — Shih IP Law Group, PLLC.

(57) ABSTRACT

A transfer device, configured to hold a substrate to be thinned and configured to be moved along a transfer path through which the substrate is transferred, includes a grip member configured to hold a frame to which the substrate is mounted with a tape therebetween; a guide member configured to be moved along the transfer path together with the grip member and configured to place thereon the frame held by the grip member; and a moving mechanism configured to move the grip member with respect to the guide member to move the frame held by the grip member along the guide member.

10 Claims, 37 Drawing Sheets

(51) Int. Cl.
   *H01L 21/68*      (2006.01)
   *H01L 21/683*     (2006.01)
   *H01L 21/78*      (2006.01)

(52) U.S. Cl.
   CPC .......... *H01L 21/68* (2013.01); *H01L 21/6838* (2013.01); *H01L 21/78* (2013.01)

(58) Field of Classification Search
   CPC ............... H01L 21/78; H01L 21/67778; H01L 21/68707; H01L 21/67132; H01L 21/67739; H01L 21/304; H01L 21/6836
   See application file for complete search history.

(56)            References Cited

FOREIGN PATENT DOCUMENTS

| | | | |
|---|---|---|---|
| JP | 2002246433 A | * | 8/2002 |
| JP | 2004119784 A | * | 4/2004 |
| JP | 2008235736 A | | 10/2008 |
| JP | 2009117584 A | | 5/2009 |
| JP | 2009253225 A | * | 10/2009 |
| JP | 2009253225 A | | 10/2009 |
| JP | 2011135026 A | | 7/2011 |
| JP | 2012049164 A | | 3/2012 |
| JP | 2013030703 A | | 2/2013 |
| JP | 2015185657 A | | 10/2015 |
| KR | 1020040049473 A | | 6/2004 |

* cited by examiner

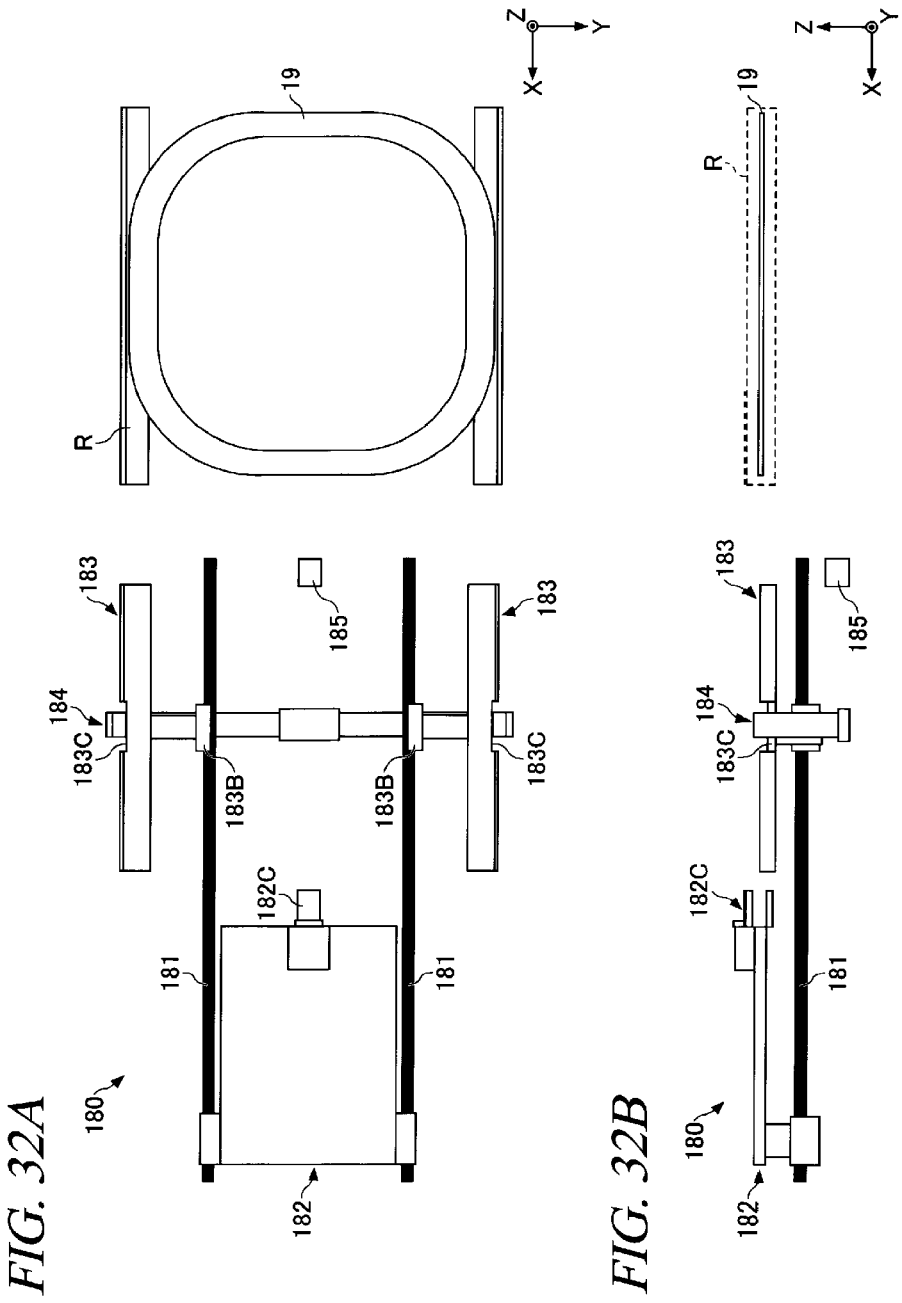

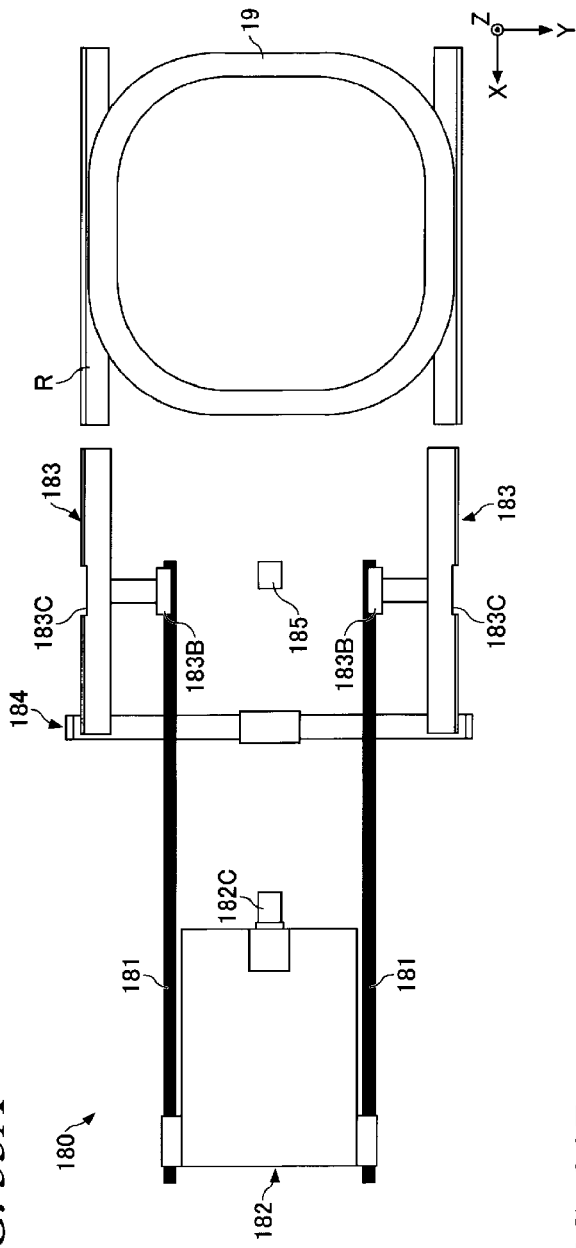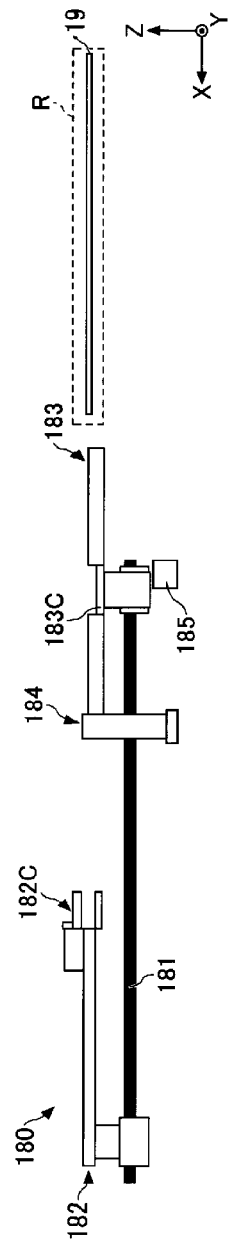
FIG. 33A
FIG. 33B

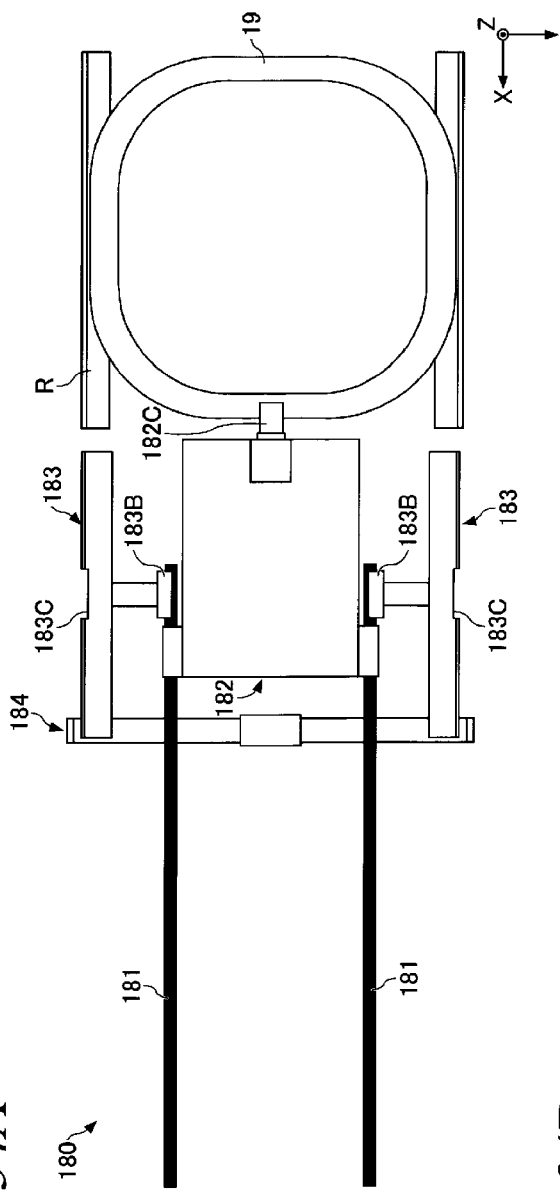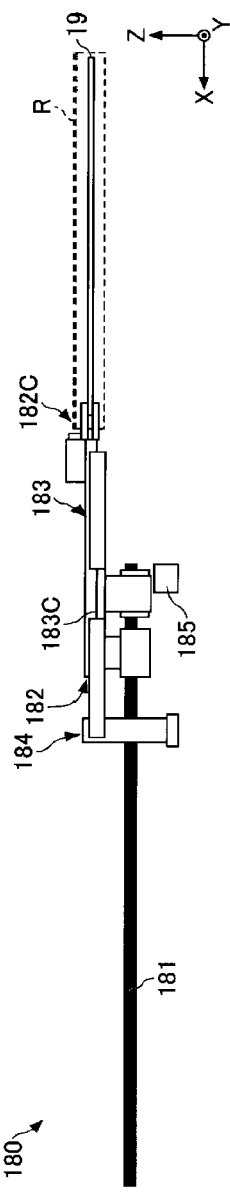
FIG. 34A
FIG. 34B

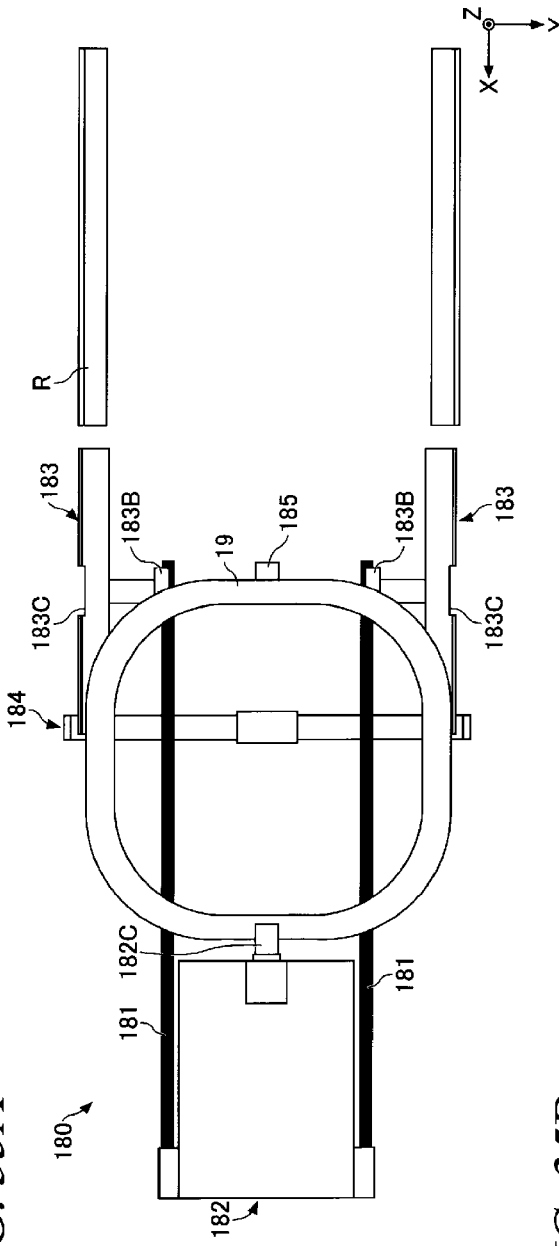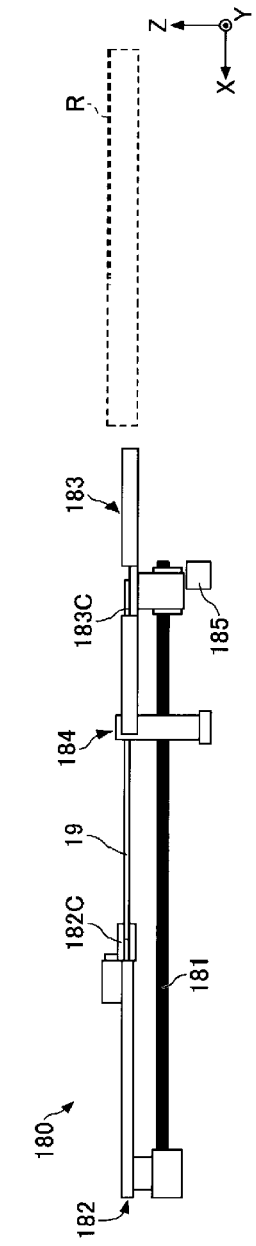

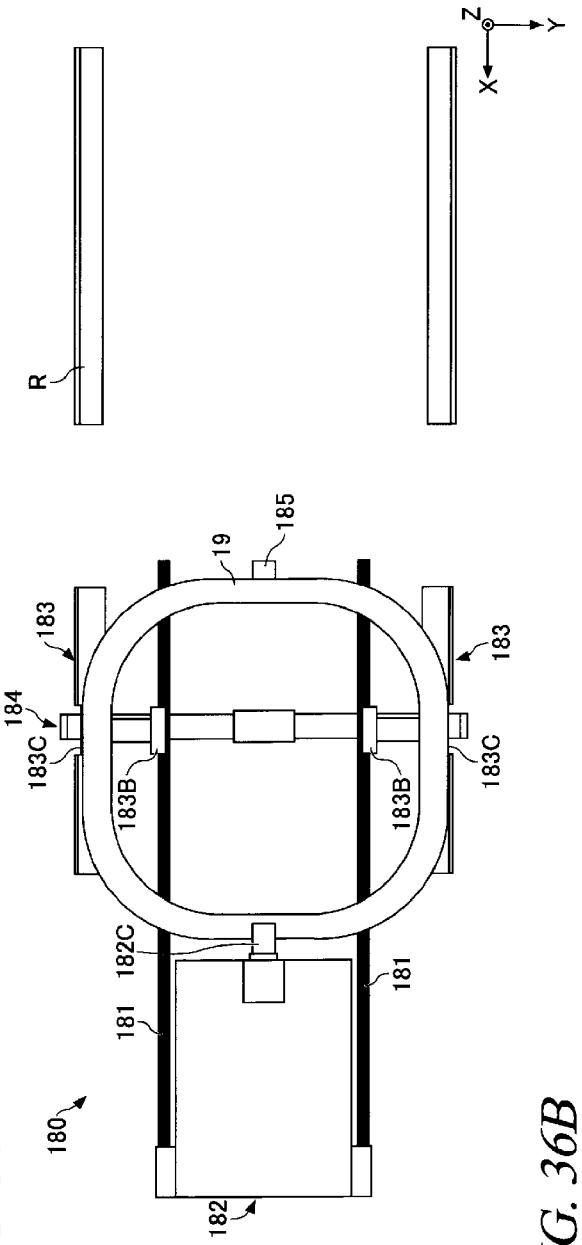
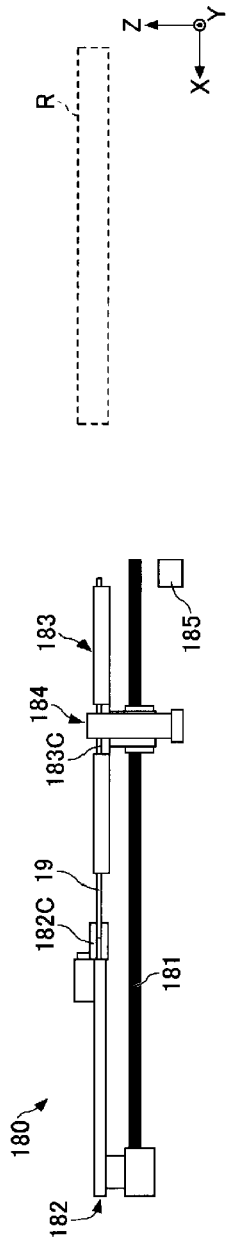
FIG. 36A
FIG. 36B

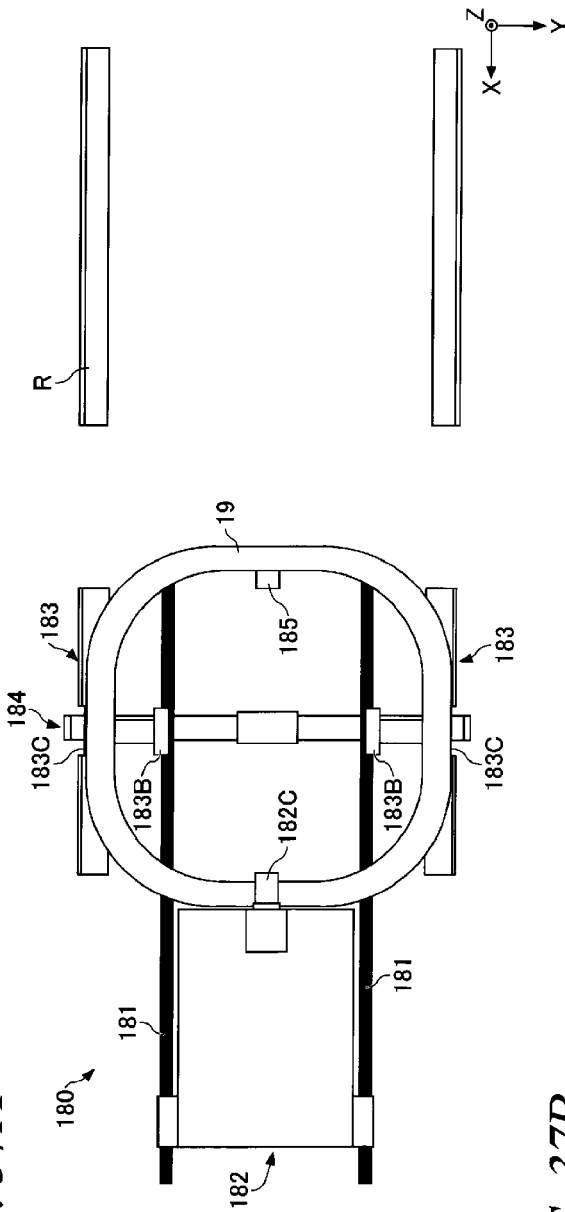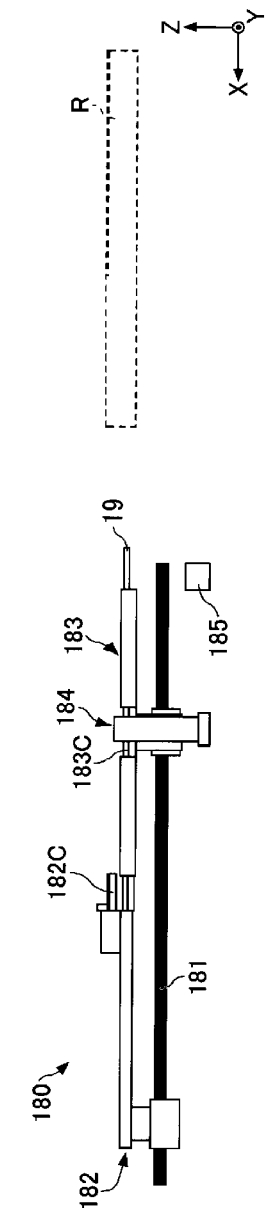
FIG. 37A
FIG. 37B

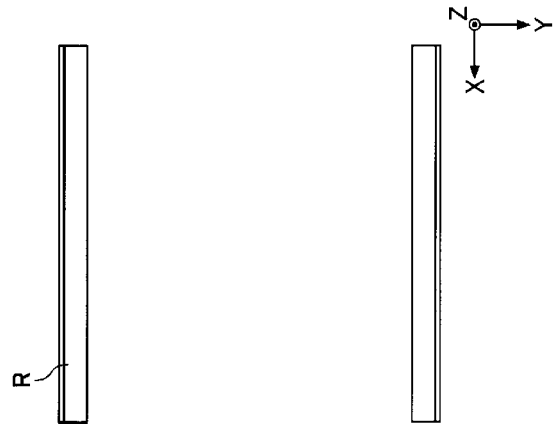
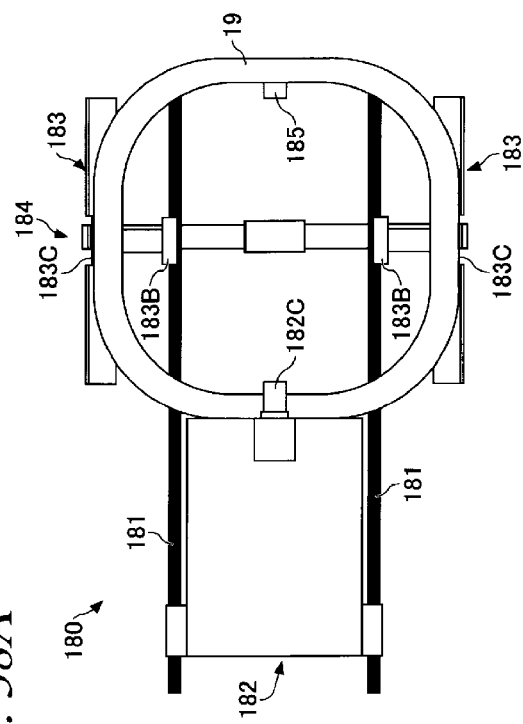
FIG. 38A
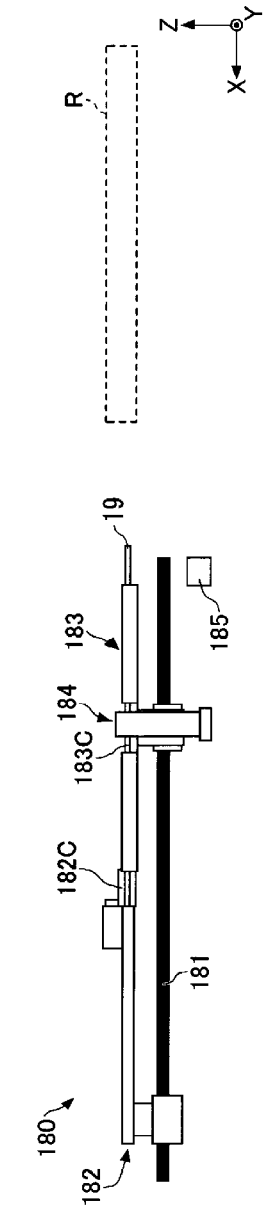
FIG. 38B

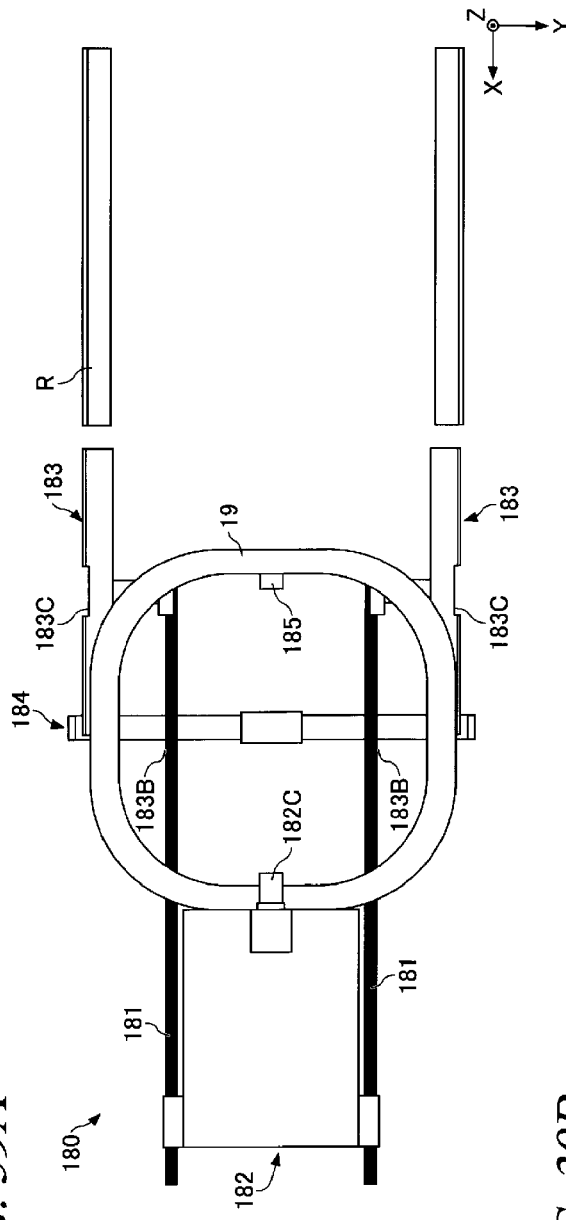
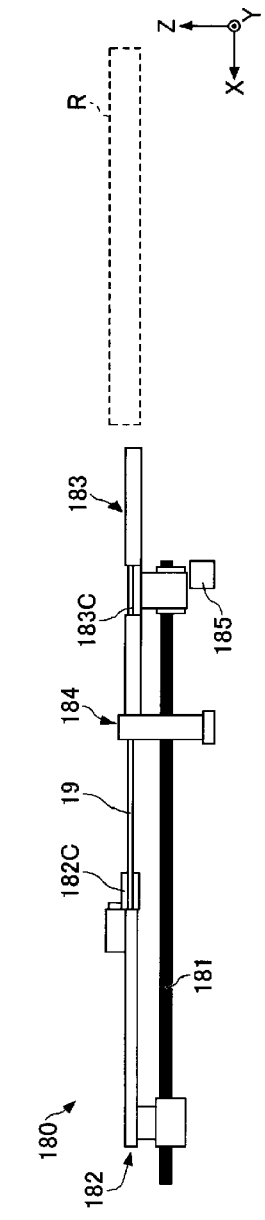
FIG. 39A
FIG. 39B

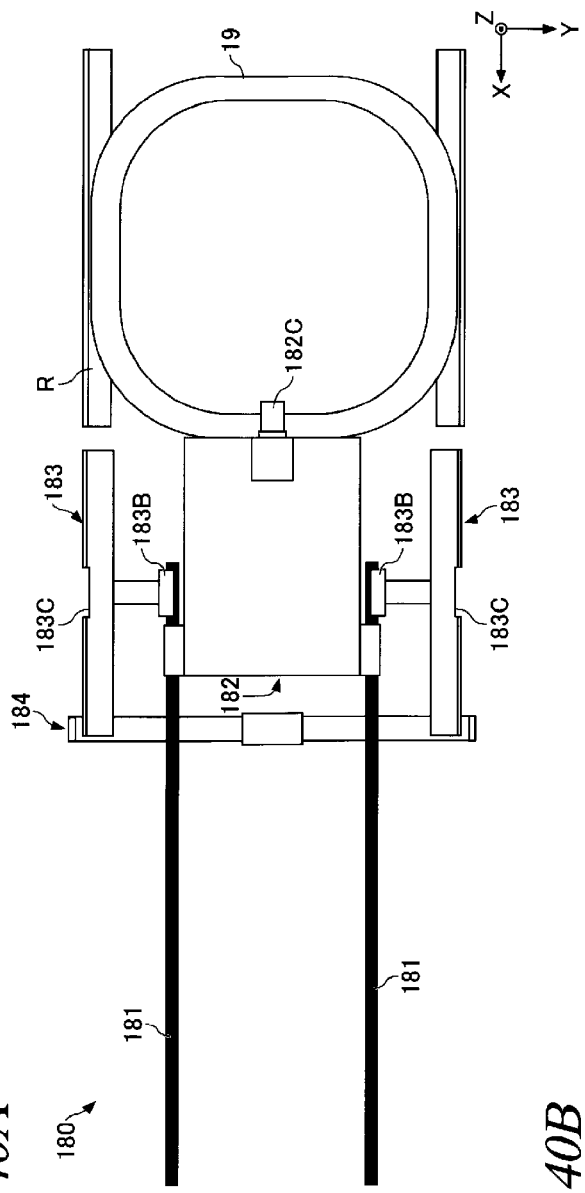
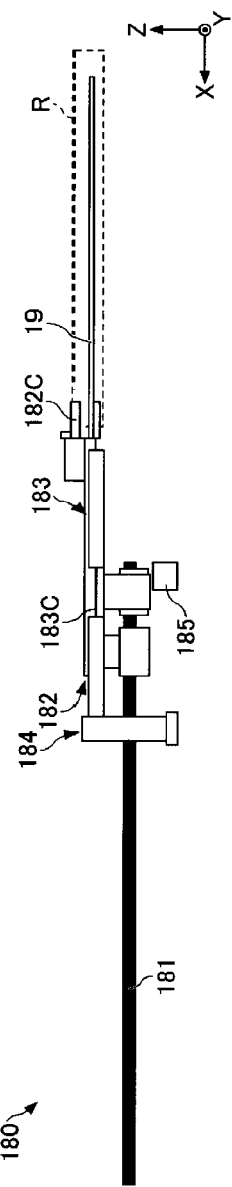
FIG. 40A
FIG. 40B

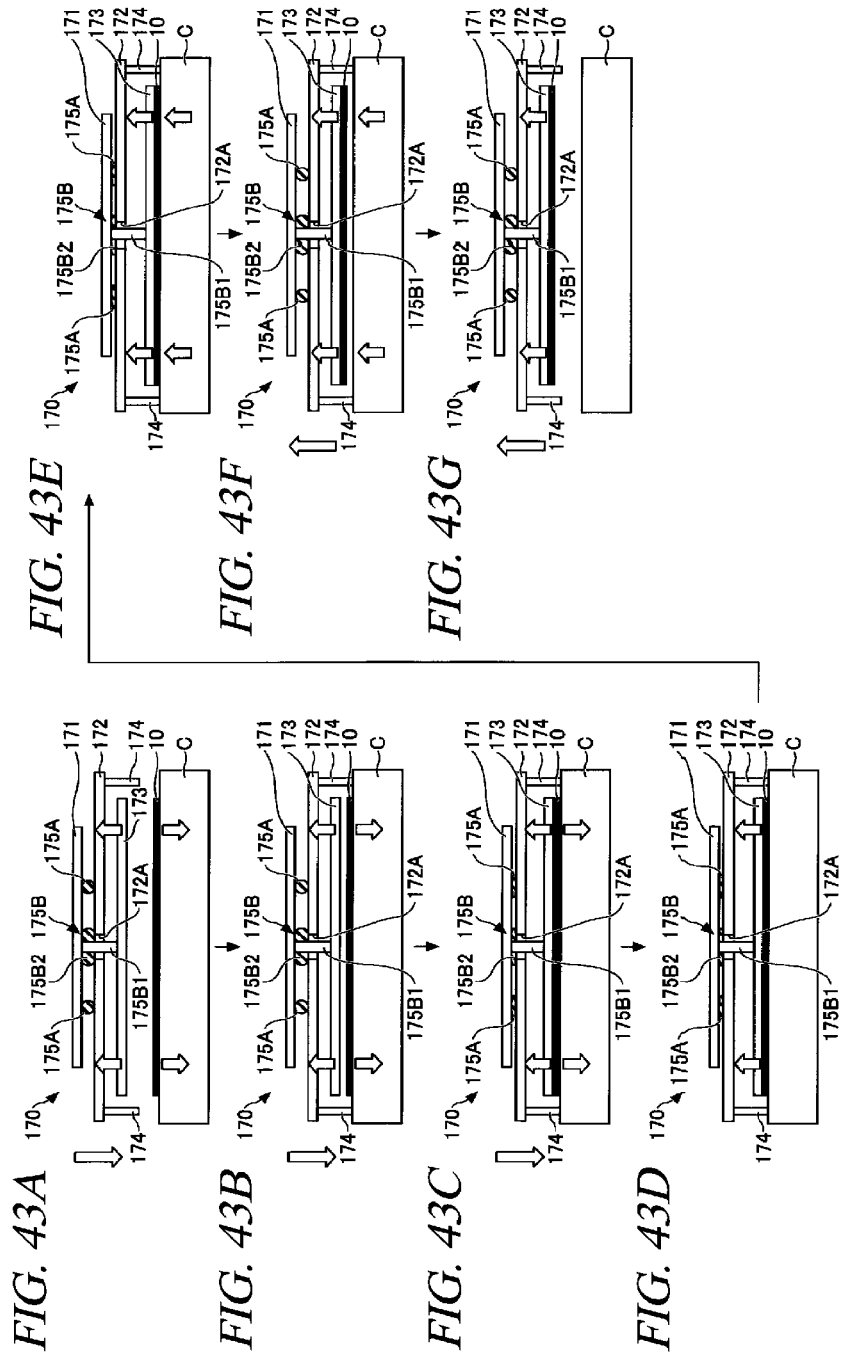

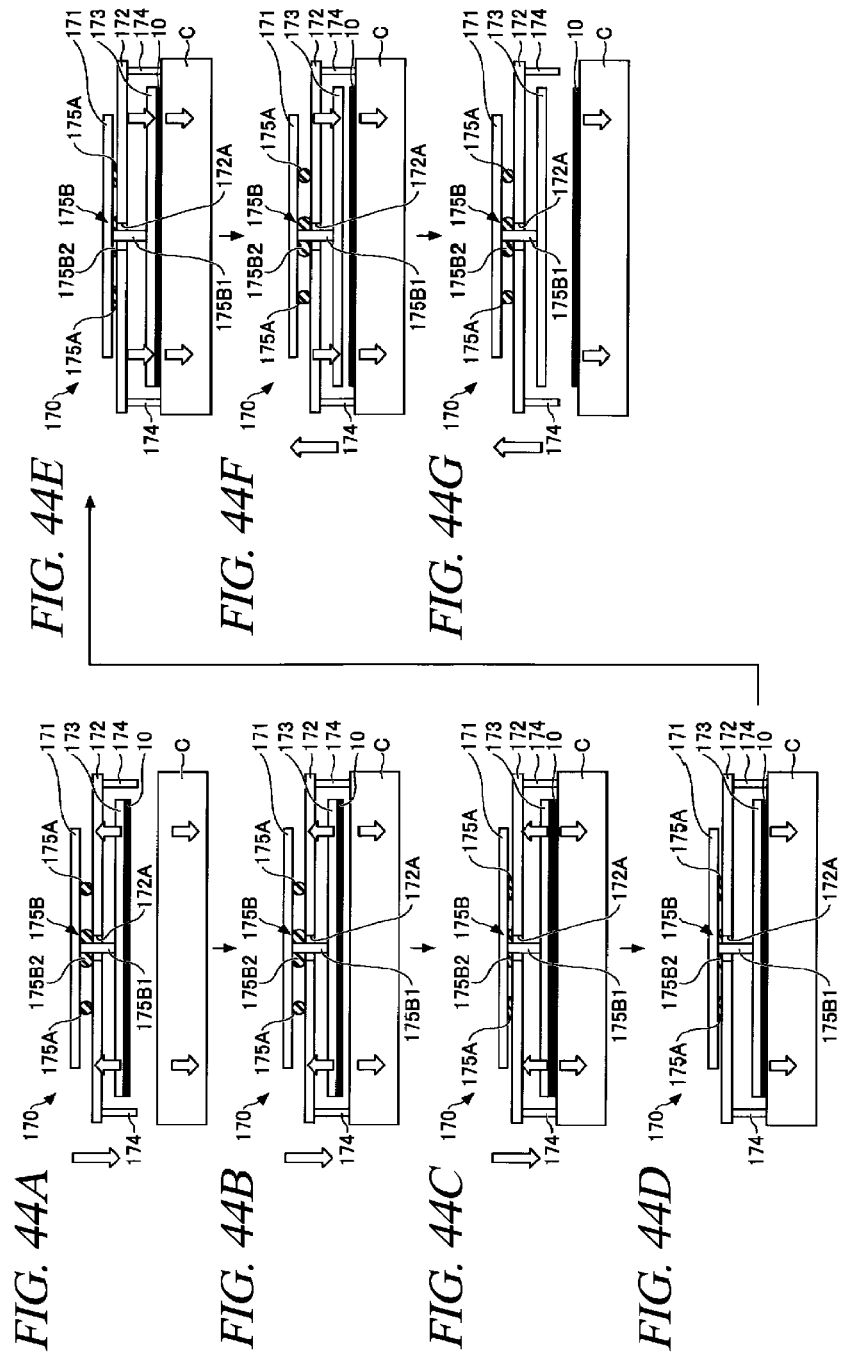

TRANSFER DEVICE, SUBSTRATE PROCESSING SYSTEM, TRANSFER METHOD AND SUBSTRATE PROCESSING METHOD

CROSS-REFERENCE TO RELATED APPLICATION

This Application is a U.S. national phase application under 35 U.S.C. § 371 of PCT Application No. PCT/JP2018/024927 filed on Jun. 29, 2018, which claims the benefit of Japanese Patent Application Nos. 2017-136322 and 2018-007669 filed on Jul. 12, 2017 and Jan. 19, 2018, respectively, the entire disclosures of which are incorporated herein by reference.

TECHNICAL FIELD BACKGROUND

The various aspects and embodiments described herein pertain generally to a transfer device, a substrate processing system, a transfer method and a substrate processing method.

BACKGROUND

Recently, to cope with a demand for reducing a size and a weight of a semiconductor device, a substrate such as a semiconductor wafer is thinned by grinding a second main surface of the substrate opposite to a first main surface on which an element, a circuit, a terminal or the like is formed.

A grinding apparatus described in Patent Document 1 is equipped with a supply cassette table, a recovery cassette table and a carry-in/out robot. A supply cassette is detachably placed on the supply cassette table, and a recovery cassette is detachably placed on the recovery cassette table.

The supply cassette and the recovery cassette have the same configuration. Multiple pairs of left and right shelf plates are vertically arranged on inner surfaces of both sidewalls of the supply cassette with an opening therebetween. A work unit is disposed on each pair of left and right shelf plates. Here, the work unit is a whole structure in which a wafer is supported by a frame with an adhesive tape therebetween.

The carry-in/out robot has a fork member configured to support the work unit from below. The fork member is of a plate shape and is biforked from a base end thereof. The work unit is taken out from the supply cassette by being supported on the fork member. Then, after grinding, cleaning, drying and so forth are performed on the wafer, the work unit is accommodated in the recovery cassette by the carry-in/out robot.

PRIOR ART DOCUMENT

Patent Document 1: Japanese Patent Laid-open Publication No. 2011-135026

DISCLOSURE OF THE INVENTION

Problems to be Solved by the Invention

Means for Solving the Problems

In one exemplary embodiment, there is provided a transfer device configured to hold a substrate to be thinned and configured to be moved along a transfer path through which the substrate is transferred. The transfer device includes a grip member configured to hold a frame to which the substrate is mounted with a tape therebetween; a guide member configured to be moved along the transfer path together with the grip member and configured to place thereon the frame held by the grip member; and a moving mechanism configured to move the grip member with respect to the guide member to move the frame held by the grip member along the guide member.

BRIEF DESCRIPTION OF THE DRAWINGS

FIG. 32A and FIG. 32B are diagrams illustrating a first process of a frame receiving operation and a seventh process of a frame handover operation by the third holder according to the third exemplary embodiment.

FIG. 33A and FIG. 33B are diagrams illustrating a second process of the frame receiving operation and a sixth process of the frame handover operation by the third holder according to the third exemplary embodiment.

FIG. 34A and FIG. 34B are diagrams illustrating a third process of the frame receiving operation by the third holder according to the third exemplary embodiment.

FIG. 35A and FIG. 35B are diagrams illustrating a fourth process of the frame receiving operation by the third holder according to the third exemplary embodiment.

FIG. 36A and FIG. 36B are diagrams illustrating a fifth process of the frame receiving operation by the third holder according to the third exemplary embodiment.

FIG. 37A and FIG. 37B are diagrams illustrating a sixth process of the frame receiving operation by the third holder according to the third exemplary embodiment.

FIG. 38A and FIG. 38B are diagrams illustrating a seventh process of the frame receiving operation by the third holder according to the third exemplary embodiment.

FIG. 39A and FIG. 39B are diagrams illustrating a first process of the frame handover operation by the third holder according to the third exemplary embodiment.

FIG. 40A and FIG. 40B are diagrams illustrating a second process of the frame handover operation by the third holder according to the third exemplary embodiment.

FIG. 43A to FIG. 43G are diagrams illustrating processes of a substrate receiving operation by the second holder according to the fourth exemplary embodiment.

FIG. 44A to FIG. 44G are diagrams illustrating processes of a substrate handover operation by the second holder according to the fourth exemplary embodiment.

DETAILED DESCRIPTION

Figure 1:
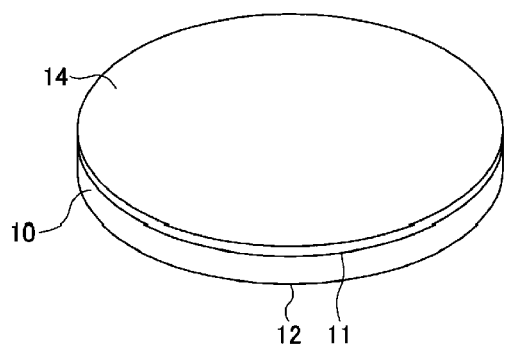
FIG. 1 is a perspective view illustrating a substrate before being processed by a substrate processing system according to a first exemplary embodiment.

Hereinafter, exemplary embodiments of the present disclosure will be described in detail with reference to the accompanying drawings. In the various drawings, same or corresponding parts will be assigned same reference numerals, and redundant description may be omitted. In the following description, the X direction, the Y direction and the Z direction are orthogonal to each other, and the X and Y directions are horizontal directions whereas the Z direction is a vertical direction. A rotational direction around a vertical axis is also referred to as "θ direction." In the present specification, below means vertically below, and above means vertically above.

First Exemplary Embodiment

<Substrate Before being Processed by Substrate Processing System>

FIG. 1 is a perspective view illustrating a substrate before being processed by a substrate processing system according to a first exemplary embodiment. A substrate 10 is, by way of example, a semiconductor substrate, a sapphire substrate, or the like. A first main surface 11 of the substrate 10 is divided into multiple regions by a plurality of streets formed in a lattice shape, and an element, a circuit, a terminal and so forth are previously formed on each region. By dividing the substrate 10 along the plurality of streets formed in the lattice shape, chips 13 (see FIG. 2) are obtained.

A protection tape 14 is bonded to the first main surface 11 of the substrate 10. The protection tape 14 is configured to protect the first main surface 11 of the substrate 10 while processings such as dicing and thinning are being performed, thus protecting the elements, the circuits, the terminals and so forth which are formed on the first main surface 11 in advance.

The protection tape 14 includes a sheet member and an adhesive coated on a surface of the sheet member. The adhesive may be hardened if an ultraviolet ray is irradiated thereto, so that adhesive strength thereof may be reduced. After the adhesive strength is weakened, the protection tape 14 can be peeled off from the substrate 10 in a simple manner through a peeling operation.

<Substrate after being Processed by Substrate Processing System>

Figure 2:
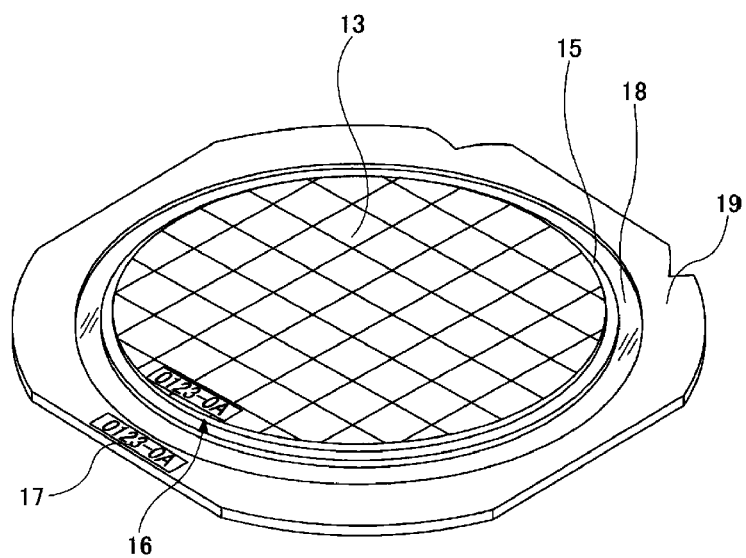
FIG. 2 is a perspective view illustrating the substrate after being processed by the substrate processing system according to the first exemplary embodiment.

FIG. 2 is a perspective view illustrating the substrate after being processed by the substrate processing system according to the first exemplary embodiment. After being diced and thinned, the substrate 10 is mounted to a frame 19 with an adhesive tape 18 therebetween. Further, the protection tape 14 shown in FIG. 1 is removed by being peeled off from the substrate 10.

The adhesive tape 18 includes a sheet member and an adhesive coated on a surface of the sheet member. The adhesive tape 18 is mounted to the frame 19 to cover an opening of the frame 19 having an annular shape, and is bonded to the substrate 10 in the opening of the frame 19.

Accordingly, it is possible to transfer the substrate 10 while holding the frame 19, so that handling of the substrate 10 can be eased.

A DAF (Die Attach Film) 15 may be provided between the adhesive tape 18 and the substrate 10, as illustrated in FIG. 2. The DAF 15 is an adhesive sheet for die bonding. The DAF 15 is used to stack the chips 13, for example. The DAF 15 may have conductivity or insulation property.

The DAF 15 is formed to be smaller than the opening of the frame 19 and is disposed at an inner side of the frame 19. The DAF 15 covers an entire second main surface 12 of the substrate 10. If stacking of the chips 13 is not performed, the DAF 15 is not necessary. In such a case, the substrate 10 may be fixed to the frame 19 with only the adhesive tape 18 therebetween.

<Substrate Processing System>

Figure 3:
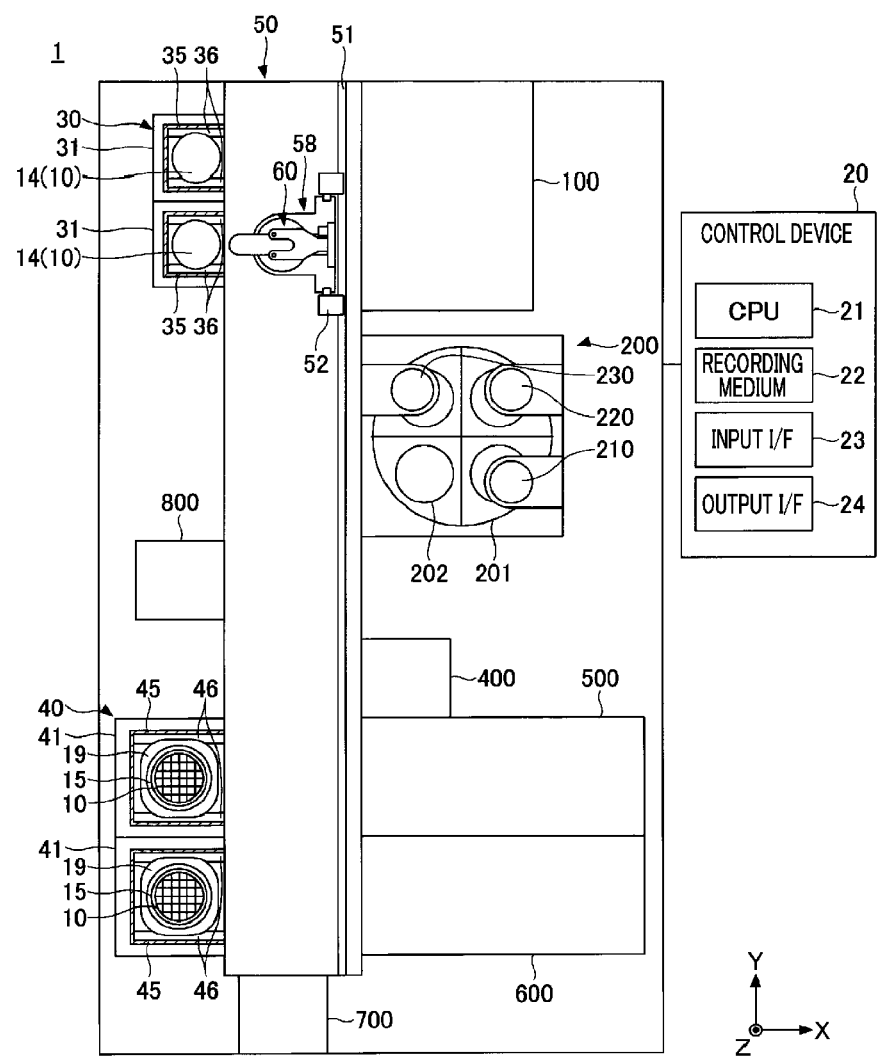
FIG. 3 is a plan view illustrating the substrate processing system according to the first exemplary embodiment.

FIG. 3 is a plan view illustrating the substrate processing system according to the first exemplary embodiment. Among a first holder 60, a second holder 70 and a third holder 80 shown in FIG. 11, only the first holder 60 is illustrated in FIG. 3. Further, in FIG. 3, carry-in cassettes 35 and carry-out cassettes 45 are cut out so that the inside of the carry-in cassettes 35 and the inside of the carry-out cassettes 45 are shown.

The substrate processing system 1 performs various processings such as dicing of the substrate 10, thinning of the substrate 10, ultraviolet irradiation to the protection tape 14, mounting of the substrate 10, peeling of the protection tape 14 from the substrate 10, ID attachment to the frame 19, and so forth.

The substrate processing system 1 is equipped with a controller 20, a carry-in unit 30, a carry-out unit 40, a transfer path 50, a transfer unit 58 (transfer device), and various kinds of processing units. The processing units may include, by way of example, a dicing unit 100, a thinning unit 200, an ultraviolet irradiating unit 400, a mounting unit 500, a peeling unit 600 and an ID attaching unit 700, though not particularly limited.

The controller 20 is implemented by, for example, a computer, and includes, as illustrated in FIG. 3, a CPU (Central Processing Unit) 21, a recording medium 22 such as a memory, an input interface 23 and an output interface 24. The controller 20 performs various kinds of controls by allowing the CPU 21 to execute a program stored in the recording medium 22. Further, the controller 20 receives a signal from the outside through the input interface 23 and sends a signal to the outside through the output interface 24.

The program of the controller 20 is stored in information recording medium and installed from the information recording medium. The information recording medium may be, by way of non-limiting example, a hard disk (HD), a flexible disk (FD), a compact disk (CD), a magnet optical disk (MO), a memory card, or the like. Further, the program may be installed by being downloaded from a server through Internet.

The carry-in cassettes 35 each accommodating therein substrates 10 before being processed are carried into the carry-in unit 30. Each carry-in cassette 35 accommodates therein a multiple number of substrates 10, which are not yet mounted to the frame 19 with the adhesive tape 18 therebetween, before being thinned while maintaining a regular distance therebetween in the Z direction.

To accommodate the multiple number of substrates 10 at the regular distance therebetween in the Z direction, the carry-in cassette 35 has multiple pairs of horizontally placed accommodation plates 36 arranged in the Z direction at a regular distance therebetween. Each pair of accommodation plates 36 supports both ends of the substrate 10 in the Y direction, as illustrated in FIG. 3.

The carry-in unit 30 is equipped with multiple placing plates 31 on which the carry-in cassettes 35 are placed. The placing plates 31 are arranged in a row in the Y direction. The number of the placing plates 31 is not limited to the shown example.

The carry-out cassettes 45 each accommodating therein the substrates 10 after being processed are carried out from the carry-out unit 40. Each carry-out cassette 45 accommodates therein a multiple number of substrates 10, which are mounted to the frame 19 with the adhesive tape 18 therebetween, after being thinned while maintaining a regular distance therebetween in the Z direction.

To accommodate the multiple number of substrates 10 at the regular distance therebetween in the Z direction, the carry-out cassette 45 has multiple pairs of horizontally placed accommodation plates 46 arranged in the Z direction at a regular distance therebetween. Each pair of accommodation plates 46 supports both ends of the frame 19 in the Y direction, as illustrated in FIG. 3.

The carry-out unit 40 is equipped with multiple placing plates 41 on which the carry-out cassettes 45 are placed. The placing plates 41 are arranged in a row in the Y direction. The number of the placing plates 41 is not limited to the shown example.

The transfer path 50 is a path through which the transfer unit 58 transfers the substrate 10 into/from the carry-in unit 30, the carry-out unit 40 and the plurality of processing units, and extends in, for example, the Y direction. A Y-axis guide 51 extending in the Y direction is provided in the transfer path 50, and a Y-axis slider 52 is configured to be movable along the Y-axis guide 51.

The transfer unit 58 is configured to hold the substrate 10 and be moved along the transfer path 50 to deliver the substrate 10 to the carry-in unit 30, the carry-out unit 40 and the plurality of processing units. The transfer unit 58 includes the Y-axis slider 52 as a transfer base body, and so forth.

The carry-in unit 30, the carry-out unit 40 and the plurality of processing units are disposed adjacent to the transfer path 50. By way of example, the transfer path 50 extends in the Y direction, and the carry-in unit 30 and the carry-out unit 40 are provided adjacent to one side of the transfer path 50 in the X direction, and the dicing unit 100, the thinning unit 200, the ultraviolet irradiating unit 400, the mounting unit 500 and the peeling unit 600 are provided adjacent to the opposite side of the transfer path 50 in the X direction. Further, the ID attaching unit 700 is provided adjacent to one side of the transfer path 50 in the Y direction.

According to the present exemplary embodiment, the carry-in unit 30 and the plurality of processing units are disposed adjacent to the transfer path 50. Accordingly, the transfer unit 58 is capable of delivering the substrate 10 to the carry-in unit 30 and the plurality of processing units. Thus, the transfer unit 58 can be multi-functionalized and a work amount of the transfer unit 58 can be increased. Therefore, an operating rate of the transfer unit 58 can be improved.

Further, according to the present exemplary embodiment, the carry-out unit 40 is also disposed adjacent to the transfer path 50. Accordingly, the transfer unit 58 is capable of delivering the substrate 10 to the carry-out unit 40. Thus, the transfer unit 58 can be further multi-functionalized and the work amount of the transfer unit 58 can be further increased. Therefore, the operating rate of the transfer unit 58 can be further improved. Moreover, since the plurality of processing units and the carry-out unit 40 are disposed adjacent to the transfer path 50, if there is an abnormal substrate 10 in one processing unit, this abnormal substrate 10 can be transferred to the carry-out unit 40 promptly without being transferred to another processing unit.

Further, the layout and the number of the processing units are not limited to the example shown in FIG. 3 but can be selected as required. Further, the plurality of processing units may be dispersed or combined into required units. Now, the individual processing units will be described.

<Dicing Unit>

Figure 4:
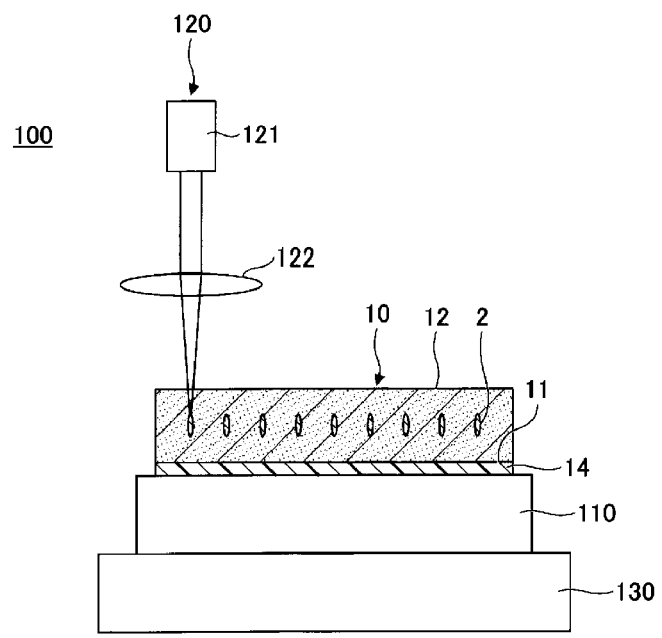
FIG. 4 is a diagram illustrating a dicing unit according to the first exemplary embodiment.

FIG. 4 is a diagram illustrating the dicing unit according to the first exemplary embodiment. The dicing unit 100 is configured to perform dicing of the substrate 10. In the present specification, the dicing of the substrate 10 implies a processing for dividing the substrate 10 into the multiple chips, 13 and includes dividing the substrate 10 and forming division points on the substrate 10. The dicing unit 100 includes, for example, a dicing table 110, a substrate processing unit 120 and a moving mechanism 130.

The dicing table 110 holds the substrate 10 with the protection tape 14 therebetween. By way of example, the dicing table 110 holds the substrate 10 horizontally with the second main surface 12 of the substrate 10 facing upwards. The dicing table 110 may be, for example, a vacuum chuck, an electrostatic chuck, or the like.

The substrate processing unit 120 is configured to perform the dicing of the substrate 10 held on the dicing table 110, for example. The substrate processing unit 120 includes, by way of example, a laser oscillator 121 and an optical system 122 configured to irradiate a laser beam from the laser oscillator 121 to the substrate 10. The optical system 122 is composed of, for example, a condensing lens configured to concentrate the laser beam from the laser oscillator 121 toward the substrate 10.

The moving mechanism 130 is configured to allow the dicing table 110 and the substrate processing unit 120 to be moved relative to each other. For example, the moving mechanism 130 may be composed of a XYZθ stage configured to move the dicing table 110 in the X direction, the Y direction, the Z direction and the θ direction.

The controller 20 controls the substrate processing unit 120 and the moving mechanism 130 to perform the dicing of the substrate 10 along the streets of the substrate 10. As shown in FIG. 4, a modified layer 2 as a point of cutting-off may be formed within the substrate 10, or a laser processing groove may be formed in a laser irradiation surface (for example, a top surface in FIG. 4) of the substrate 10. The laser processing groove may or may not be formed through the substrate 10 in a plate thickness direction thereof.

In case of forming the modified layer 2 within the substrate 10, a laser beam having permeability for the substrate 10 is used. The modified layer 2 may be formed by, for example, melting and solidifying an inside of the substrate 10 locally. Meanwhile, in case of forming the laser processing groove on the laser irradiation surface of the substrate 10, a laser beam having absorptivity for the substrate 10 is used.

Furthermore, though the substrate processing unit 120 has the laser oscillator 121 configured to irradiate the laser beam to the substrate 10 in the present exemplary embodiment, the substrate processing unit 120 may have a cutting blade configured to cut the substrate 10 or a scrubber configured to form a scribe groove on the surface of the substrate 10.

In addition, in the present exemplary embodiment, the dicing unit 100 is provided as a part of the substrate processing system 1. However, the dicing unit 100 may be provided outside the substrate processing system 1. In such a case, the substrate 10 is carried into the carry-in unit 30 from the outside after being diced, and is then transferred into the thinning unit 200 instead of the dicing unit 100 after being taken out from the carry-in cassette 35 in the carry-in unit 30.

<Thinning Unit>

The thinning unit 200 (see FIG. 3) is configured to thin the substrate 10 by processing the second main surface 12 of the diced substrate 10, which is opposite to the first main surface 11 protected by the protection tape 14.

In case that the division point is formed in the dicing unit 100, a processing stress acts on the substrate 10 in the thinning unit 200, and a crack develops from the division point in the plate thickness direction, so that the substrate 10 is divided into the multiple chips 13.

Further, in case that the modified layer 2 is formed within the substrate 10 in the dicing unit 100, the modified layer 2 is removed as the substrate 10 is thinned in the thinning unit 200.

The thinning unit 200 includes, as illustrated in FIG. 3, for example, a rotary table 201, a chuck table 202, a rough grinding unit 210, a fine grinding unit 220 and a damage layer removing unit 230.

The rotary table 201 is pivoted on a central line thereof. A plurality of (e.g., four in FIG. 3) chuck tables 202 are arranged around the central line of the rotary table 201 at a regular distance therebetween.

The chuck tables 202 are pivoted on the central line of the rotary table 201 along with the rotary table 201. The central line of the rotary table 201 is vertical. Whenever the rotary table 201 is rotated, the chuck tables 202 facing the rough grinding unit 210, the fine grinding unit 220 and the damage layer removing unit 230 are changed.

Each chuck table 202 is configured to hold the substrate 10 with the protection tape 14 therebetween. The chuck table 202 holds the substrate 10 horizontally with the second main surface 12 of the substrate 10 facing upwards. The chuck table 202 may be, by way of example, a vacuum chuck, an electrostatic chuck, or the like.

Figure 5:
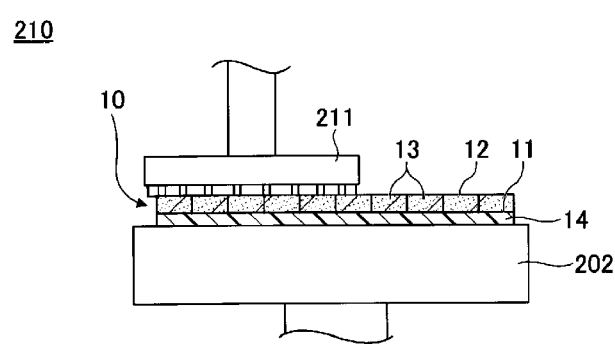
FIG. 5 is a diagram illustrating a rough grinding unit of a thinning unit according to the first exemplary embodiment.

FIG. 5 is a diagram illustrating the rough grinding unit of the thinning unit according to the first exemplary embodiment. The rough grinding unit 210 is configured to perform rough grinding of the substrate 10. The rough grinding unit 210 is equipped with, as depicted in FIG. 5, for example, a rotary whetstone 211. The rotary whetstone 211 is configured to be pivoted on a central line thereof and be moved down to process the top surface (that is, the second main surface 12) of the substrate 10 held by the chuck table 202.

The fine grinding unit 220 is configured to perform fine grinding of the substrate 10. A configuration of the fine grinding unit 220 is substantially the same as the configuration of the rough grinding unit 210. However, an average diameter of grinding particles of a rotary whetstone of the fine grinding unit 220 is smaller than an average diameter of grinding particles of the rotary whetstone of the rough grinding unit 210.

The damage layer removing unit 230 is configured to remove a damage layer formed on the second main surface 12 of the substrate 10 due to the rough grinding and the fine grinding. By way of example, the damage layer removing unit 230 removes the damage layer by supplying a processing liquid onto the substrate 10 and performing a wet etching processing. Here, however, a method for removing the damage layer is not particularly limited.

Further, the thinning unit 200 may have a polishing unit configured to polish the substrate 10. A configuration of the polishing unit is substantially the same as that of the rough grinding unit 210. For the polishing of the substrate 10, CMP (Chemical Mechanical Polishing) may be used, for example. Furthermore, the thinning unit 200 may have a gettering unit configured to form a gettering site (for example, a crystal defect or distortion) for capturing an impurity. Though the number of the chuck tables 202 is four in FIG. 3, this number can be appropriately changed depending on the number of kinds of processings. Further, a single processing unit (for example, the damage layer removing unit 230) may perform multiple kinds of processings (for example, removal of the damage layer and formation of the gettering site).

<Ultraviolet Irradiating Unit>

Figure 6:
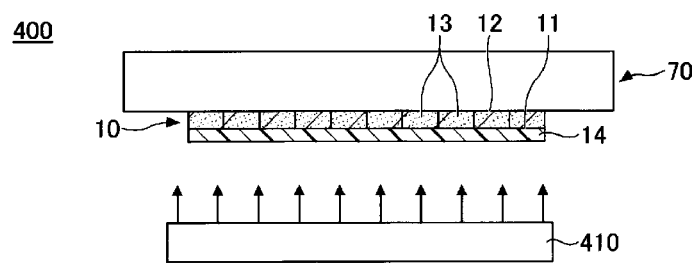
FIG. 6 is a diagram illustrating an ultraviolet irradiating unit according to the first exemplary embodiment.

FIG. 6 is a diagram illustrating the ultraviolet irradiating unit according to the first exemplary embodiment. The ultraviolet irradiating unit 400 is configured to irradiate an ultraviolet ray to the protection tape 14. Since the adhesive of the protection tape 14 can be hardened by the irradiation of the ultraviolet ray, the adhesive strength of the protection tape 14 can be reduced. After the adhesive strength is weakened, the protection tape 14 can be peeled off from the substrate 10 simply through the peeling operation.

The ultraviolet irradiating unit 400 has a UV lamp 410 within a housing into which the substrate 10 protected by the protection tape 14 is carried in. The UV lamp 410 irradiates the ultraviolet ray to the protection tape 14 from an opposite side to the substrate 10 with the protection tape 14 therebetween.

<Mounting Unit>

Figure 7:
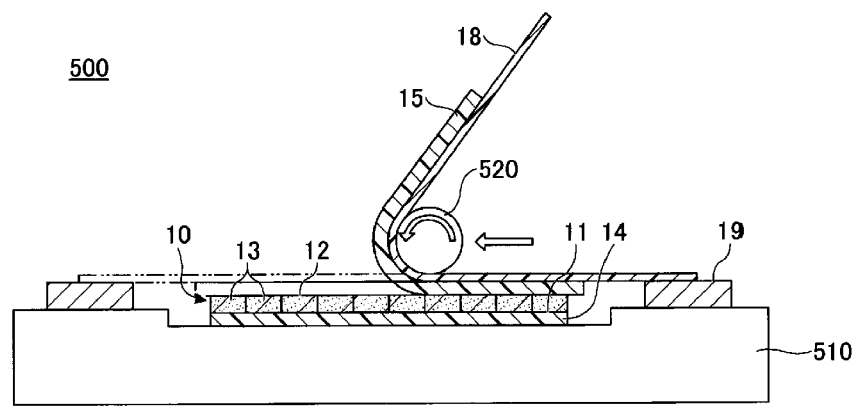
FIG. 7 is a diagram illustrating a mounting unit according to the first exemplary embodiment.

FIG. 7 is a diagram illustrating the mounting unit according to the first exemplary embodiment. In FIG. 7, a dashed double-dotted line indicates a state after the adhesive tape 18 and the DAF 15 are mounted. The mounting unit 500 is configured to mount the substrate 10 after being diced and thinned to the frame 19 with the adhesive tape 18 therebetween. The adhesive tape 18 is fixed to the frame 19 to cover the opening of the frame 19 having an annular shape, and is bonded to the substrate 10 in the opening of the frame 19.

In the mounting unit 500, the substrate 10 after being diced and thinned may be mounted to the frame 19 with only the adhesive tape 18 therebetween. In FIG. 7, however, the substrate 10 is mounted to the frame 19 with the adhesive tape 18 and the DAF 15, which are stacked in advance, therebetween. The DAF 15 is formed to be smaller than the opening of the frame 19 and is provided at the inner side of the frame 19. The DAF 15 covers the entire second main surface 12 of the substrate 10.

The mounting unit 500 is equipped with, for example, a mounting table 510 configured to hold the substrate 10 and the frame 19; and an attaching member 520 configured to attach the substrate 10 to the frame 19 held by the mounting table 510 with the adhesive tape 18 therebetween.

The mounting table 510 holds the frame 19 and the substrate 10 placed in the opening of the frame 19 in parallel to each other. The frame 19 and the substrate 10 may be held horizontally. A top surface of the frame 19 and the top surface of the substrate 10 may have a height difference equal to a thickness of the DAF 15. Further, when the DAF 15 is not used, the top surface of the frame 19 and the top surface of the substrate 10 may be placed on the same plane.

The attaching member 520 may be, by way of example, a laminate roller.

The adhesive tape 18 or the like are supplied while being wound around a core and is used by being unwound from the core. The adhesive tape 18 passes through a gap between the laminate roller and the substrate 10 while sticking to the laminate roller due to a tension, and is thus stacked on the substrate 10. Further, the adhesive tape 18 passes through the gap between the laminate roller and the frame 19 while sticking to the laminate roller due to the tension, and is thus stacked on the frame 19.

The mounting unit 500 allows the adhesive tape 18 to be attached to the frame 19 and the substrate 10 from one side of the frame 19 toward the other side thereof in sequence, as depicted in FIG. 7. Accordingly, entrance of air or the like can be suppressed. Further, since the substrate 10 is maintained flat while the adhesive tape 18 is attached to the substrate 10, a damage on the substrate 10 can be suppressed.

<Peeling Unit>

Figure 8:
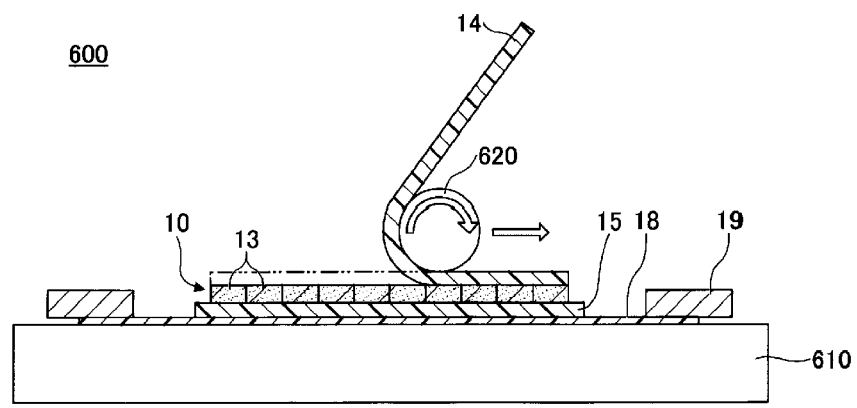
FIG. 8 is a diagram illustrating a peeling unit according to the first exemplary embodiment.

FIG. 8 is a diagram illustrating the peeling unit according to the first exemplary embodiment. In FIG. 8, a dashed double-dotted line indicates a state of the protection tape 14 before being peeled off. The peeling unit 600 peels the protection tape 14 off the substrate 10 which is mounted to the frame 19 with the adhesive tape 18 therebetween. The unnecessary protection tape 14 can be removed. The peeling unit 600 is equipped with, for example, a peeling table 610 and a peeling roller 620.

The protection tape 14 passes through a gap between the peeling roller 620 and the substrate 10 while sticking to the peeling roller 620 due to a tension, and is thus peeled off the substrate 10. In the meantime, the peeling table 610 maintains the substrate 10 and the frame 19 flat with the adhesive tape 18 or the like therebetween. The protection tape 14 peeled off the substrate 10 is wound around a non-illustrated winding core.

The peeling unit 600 peels the protection tape 14 off the substrate 10 while transforming the protection tape 14 from one end of the substrate 10 toward the other end thereof in sequence, as illustrated in FIG. 8. Accordingly, the protection tape 14 and the substrate 10 can be separated smoothly. Further, since the substrate 10 is maintained flat while the protection tape 14 and the substrate 10 are being separated, a damage on the substrate 10 can be suppressed.

Moreover, the peeling unit 600 may peel the protection tape 14 off the substrate 10 in parallel to each other.

<ID Attaching Unit>

Figure 9:
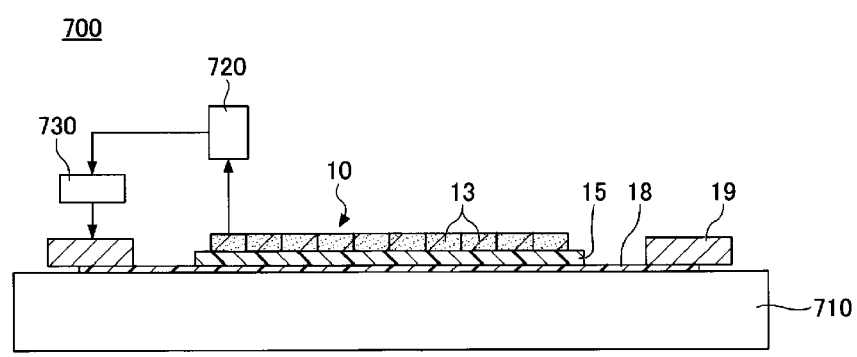
FIG. 9 is a diagram illustrating an ID attaching unit according to the first exemplary embodiment.

FIG. 9 is a diagram illustrating the ID attaching unit according to the first exemplary embodiment. The ID attaching unit 700 is configured to read identification information 16 (see FIG. 2) previously formed on the substrate 10, print the read identification information 16 on a label 17 (see FIG. 2) to attach the printed label 17 to the frame 19. The identification information 16 is information for identifying the substrate 10, and may be a number and a letter, a symbol, a one-dimensional code, a two-dimensional code, or the like.

The ID attaching unit 700 includes, for example, an ID attachment table 710, a reader 720 and a label printing device 730. The ID attachment table 710 holds the substrate 10 and the frame 19 with the adhesive tape 18 or the like therebetween. The reader 720 reads the identification information 16 previously formed on the substrate 10. The label printing device 730 prints, on the label 17, the identification information 16 read by the reader 720, and attaches the printed label 17 to the frame 19 by a laminator or the like.

<Substrate Processing Method>

Figure 10:
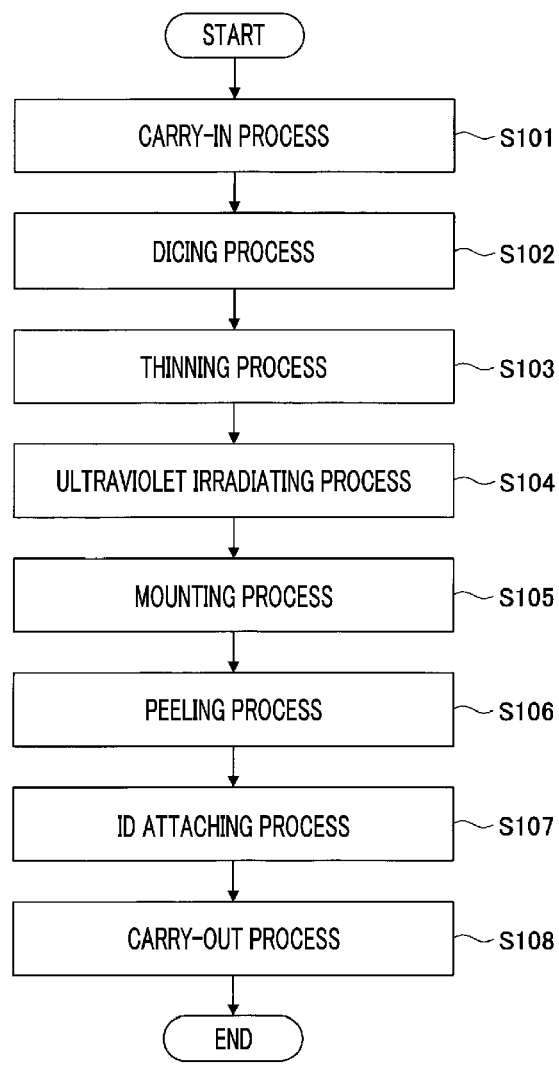
FIG. 10 is a flowchart of a substrate processing method according to the first exemplary embodiment.

Now, a substrate processing method using the substrate processing system 1 having the above-described configuration will be explained. FIG. 10 is a flowchart of the substrate processing method according to the first exemplary embodiment.

As depicted in FIG. 10, the substrate processing method includes a carry-in process S101, a dicing process S102, a thinning process S103, an ultraviolet irradiating process S104, a mounting process S105, a peeling process S106, an ID attaching process S107 and a carry-out process S108. These processes are performed under the control of the controller 20. Further, a sequence of these processes is not limited to the example shown in FIG. 10.

In the carry-in process S101, the transfer unit 58 takes out the substrate 10 from the carry-in cassette 35 placed in the carry-in unit 30, and then transfers the taken substrate 10 into the dicing unit 100.

In the dicing process S102, the dicing unit 100 performs the dicing of the substrate 10, as shown in FIG. 4. While the dicing of the substrate 10 is being performed, the first main surface 11 of the substrate 10 is protected by the protection tape 14. The substrate 10 after being diced in the dicing unit 100 is then transferred into the thinning unit 200 by the transfer unit 58.

In the thinning process S103, the thinning unit 200 processes the second main surface 12 of the substrate 10 to thereby thin the substrate 10, as illustrated in FIG. 5. While the substrate 10 is being thinned, the first main surface 11 of the substrate 10 is protected by the protection tape 14. The substrate 10 after being thinned in the thinning unit 200 is then transferred into the ultraviolet irradiating unit 400 by the transfer unit 58.

In the ultraviolet irradiating process S104, the ultraviolet irradiating unit 400 irradiates the ultraviolet ray to the protection tape 14, as illustrated in FIG. 6. Since the adhesive of the protection tape 14 can be hardened by the irradiation of the ultraviolet ray, the adhesive strength of the protection tape 14 can be reduced. After the adhesive strength is weakened, the protection tape 14 can be peeled off the substrate 10 in a simple manner through the peeling operation.

Though the ultraviolet irradiating process S104 may be performed after the mounting process S105, the ultraviolet irradiating process S104 is performed before the mounting process S105 in the present exemplary embodiment. Accordingly, the adhesive tape 18 bonded to the substrate 10 in the mounting process S105 can be suppressed from being degraded due to the irradiation of the ultraviolet ray. The substrate 10 to which the protection tape 14 to which the ultraviolet ray is irradiated in the ultraviolet irradiating unit 400 is attached is transferred into the mounting unit 500 by the transfer unit 58.

In the mounting process S105, the mounting unit 500 mounts the substrate 10 after being diced and thinned to the frame 19 with the adhesive tape 18 therebetween, as depicted in FIG. 7. The mounting unit 500 may mount the substrate 10 after being diced and thinned to the frame 19 with only the adhesive tape 18 therebetween. In the present exemplary embodiment, however, the mounting unit 500 mounts the substrate 10 after being diced and thinned to the frame 19 with the adhesive tape 18 and the DAF 15, which are stacked on top of each other in advance, therebetween. The substrate 10 mounted to the frame 19 with the adhesive tape 18 therebetween in the mounting unit 500 is then transferred into the peeling unit 600 by the transfer unit 58.

In the peeling process S106, the peeling unit 600 peels the protection tape 14 off the substrate 10 which is mounted to the frame 19 with the adhesive tape 18 therebetween by the mounting unit 500, as depicted in FIG. 8. Thus, the protection tape 14 which is now unnecessary can be removed. The substrate 10 from which the protection tape 14 is removed in the peeling unit 600 is then transferred into the ID attaching unit 700 by the transfer unit 58.

In the ID attaching process S107, as illustrated in FIG. 9, the ID attaching unit 700 reads the identification information 16 (see FIG. 2) previously formed on the substrate 10, prints the read identification information 16 on the label 17 (see FIG. 2) to attach the printed label 17 to the frame 19.

In the carry-out process S108, the transfer unit 58 transfers the substrate 10 from the ID attaching unit 700 into the carry-out unit 40 to accommodate the substrate 10 within the carry-out cassette 45 in the carry-out unit 40. The carry-out cassette 45 is carried to the outside from the carry-out unit 40. The chips 13 are individually picked from the substrate 10 which is carried to the outside by being carried in the carry-out cassette 45, so that the chips 13 are obtained.

<Transfer Unit>

Figure 11:
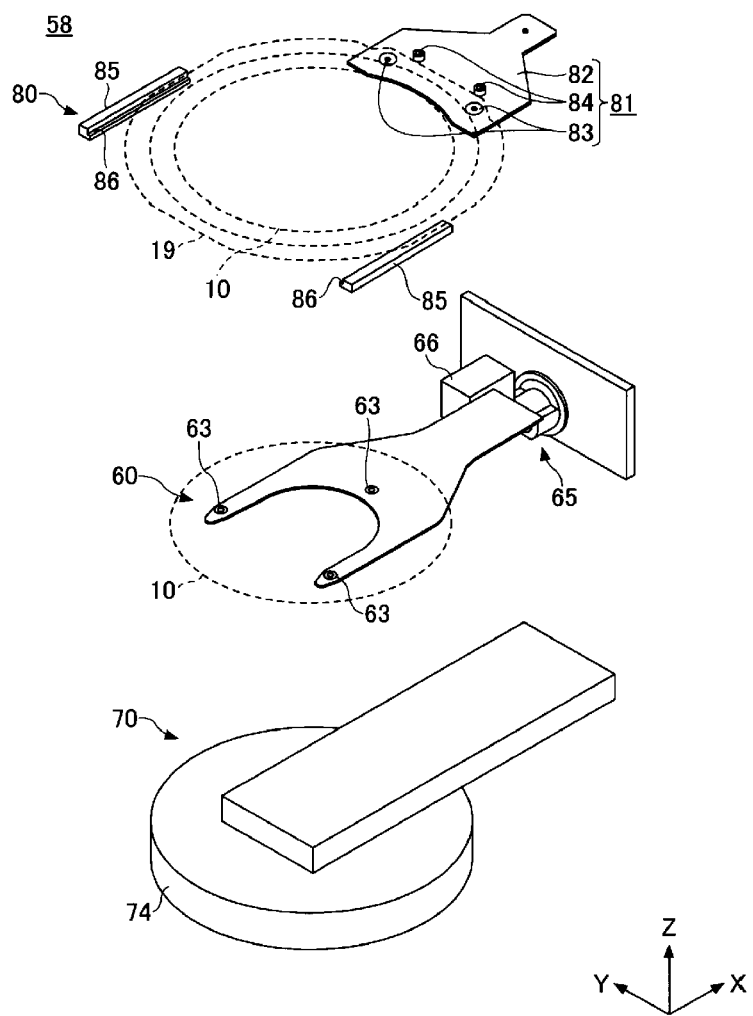
FIG. 11 is a perspective view illustrating a first holder, a second holder and a third holder of a transfer unit according to the first exemplary embodiment.

FIG. 11 is a perspective view illustrating the first holder, the second holder and the third holder belonging to the transfer unit according to the first exemplary embodiment. In FIG. 11, an outline of the substrate 10 held by the first holder 60 and the third holder 80 and an outline of the frame 19 held by the third holder are illustrated by dashed lines.

The transfer unit 58 is equipped with the first holder 60, the second holder 70 and the third holder 80. The first holder 60 holds the substrate 10 when the substrate 10 is transferred from the carry-in unit 30 into the processing unit (for example, the dicing unit 100). The second holder 70 holds the substrate 10 when the substrate 10 is transferred from the processing unit (for example, the dicing unit 100) to another processing unit (for example, the thinning unit 200). The third holder 80 holds the substrate 10 when the substrate 10 is transferred from the processing unit (for example, the ID attaching unit 700) into the carry-out unit 40.

The first holder 60, the second holder 70 and the third holder 80 are arranged at a distance therebetween in the Z direction, as shown in FIG. 11 and are moved along the transfer path 50 in the Y direction at the same time. The first holder 60, the second holder 70 and the third holder 80 may be moved at the same time in the Y direction, the Z direction and the θ direction, and be moved independently in the X direction. Below, the first holder 60, the second holder 70 and the third holder 80 will be explained.

<First Holder>

Figure 12:
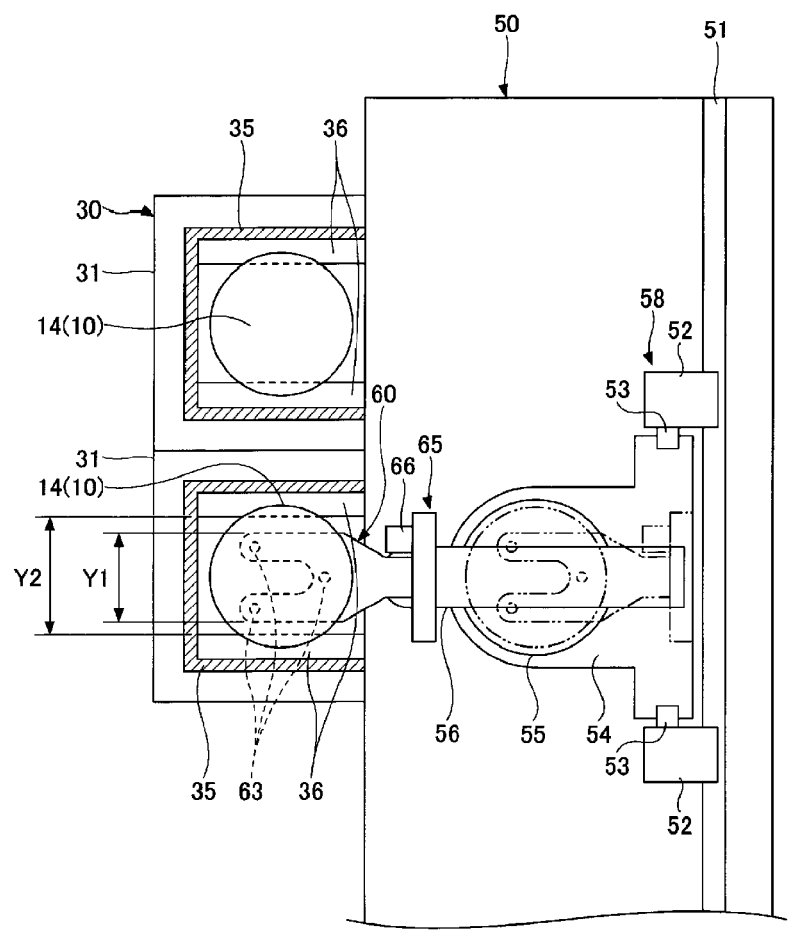
FIG. 12 is a plan view illustrating an operation in which the transfer unit according to the first exemplary embodiment takes out a substrate before being processed from a carry-in cassette.

First, the first holder 60 will be described with reference to FIG. 11 and FIG. 12. FIG. 12 is a plan view illustrating an operation in which the transfer unit according to the first exemplary embodiment takes out a substrate before being processed from the carry-in cassette.

The transfer unit 58 is equipped with, as illustrated in FIG. 12, a Y-axis slider 52 as a transfer base body configured to be moved along the transfer path 50; and the first holder 60 configured to be moved in the Y direction along with the Y-axis slider 52. The transfer unit 58 moves the first holder 60 in the X direction, the Z direction and the θ direction with respect to the Y-axis slider 52.

By way of example, a Z-axis guide 53 is fixed to the Y-axis slider 52. A rotary plate 55 is rotatably provided at a Z-axis slider 54 which is configured to be moved along the Z-axis guide 53. An X-axis guide 56 is provided at the rotary plate 55, and the first holder 60 is movable along the X-axis guide 56.

Basically, the X-axis guide 56 guides the first holder 60 in the X direction. However, as it is moved along with the rotary plate 55, the X-axis guide 56 is capable of guiding the first holder 60 in a direction (for example, the Y direction) different from the X direction.

For example, the first holder 60 holds the substrate 10 when the substrate 10 is taken out from the carry-in cassette 35 placed in the carry-in unit 30 and is transferred from the carry-in unit 30 into a first processing unit (for example, the dicing unit 100). Further, in case that the dicing unit 100 is provided at an outside of the substrate processing system 1 and the substrate 10 after being diced in advance is accommodated in the carry-in cassette 35, the first processing unit may be the thinning unit 200.

The first holder 60 is equipped with an attracting portion 63 configured to attract the substrate 10. The attracting portion 63 has, for example, a suction hole, and a gas in the suction hole is sucked in by a suction source such as, by way of example, a vacuum pump. By generating a negative pressure in the attracting portion 63 by operating the suction source, the attracting portion 63 vacuum-attracts the substrate 10. Meanwhile, by stopping the operation of the suction source and opening the suction hole of the attracting portion 63 to the atmosphere, the attracting portion 63 releases the vacuum attraction of the substrate 10. When the vacuum attraction is released, a positive pressure may be generated in the attracting portion 63. In the present specification, the negative pressure refers to a pressure lower than an atmospheric pressure, and the positive pressure refers to a pressure higher than the atmospheric pressure.

For example, the first holder 60 is formed to have a plate shape bi-forked from a base end portion toward a leading end portion thereof. The first holder 60 may have the attracting portion 63 at each of the base end portion and two leading end portions thereof. Further, the number of the attracting portions 63 is not limited to three, and one, two or more than three attracting portions 63 may be provided.

When taking the substrate 10 before being processed from the carry-in cassette 35, the transfer unit 58 first moves the first holder 60 from a position indicated by a dashed double-dotted line in FIG. 12 to a position indicated by a solid line in FIG. 12, and holds the substrate 10 with the first holder 60. Then, the transfer unit 58 returns the first holder 60 to the position indicted by the dashed double-dotted line in FIG. 12.

Now, referring to FIG. 12 again, the operation of the transfer unit 58 in which the substrate 10 before being processed is taken out from the carry-in cassette 35 will be described in detail.

First, the transfer unit 58 adjusts a position of the first holder 60 with respect to the carry-in cassette 35 in the Z direction, and then moves the first holder 60 in the X direction from the position indicated by the dashed double-dotted line in FIG. 12 to the position indicated by the solid line in FIG. 12. Accordingly, the first holder 60 is inserted into a gap between a plurality of substrates 10 arranged in the Z direction within the carry-in cassette 35.

Then, the transfer unit 58 moves the first holder 60 inserted into the carry-in cassette 35 upwards to allow the first holder 60 to be inserted between the pair of accommodation plates 36, thus allowing the substrate 10 to be held by the first holder 60. Accordingly, a width Y1 of the first holder 60 is set to be smaller than a distance Y2 between the pair of accommodation plates 36. Since the distance Y2 between the pair of accommodation plates 36 is smaller than a diameter of the main surface (for example, the second main surface 12) of the substrate 10, the width Y1 of the first holder 60 is set to be smaller than the diameter of the main surface of the substrate 10.

Then, the transfer unit 58 moves the first holder 60 in the X direction from the position indicated by the solid line in FIG. 12 to the position indicated by the dashed double-dotted line in FIG. 12. Accordingly, the first holder 60 is retreated from the carry-in cassette 35, and the substrate 10 is taken out of the carry-in cassette 35. The substrate 10 taken out of the carry-in cassette 35 is transferred from the carry-in unit 30 into the first processing unit (for example, the dicing unit 100) while being held by the first holder 60.

Here, to suppress deformation, such as peeling, of the protection tape 14, the carry-in cassette 35 accommodates the substrate 10 horizontally with the protection tape 14 facing upwards. Meanwhile, since the dicing unit 100 and the thinning unit 200 process the substrate 10, not the protection tape 14, the substrate 10 is horizontally accommodated in the dicing unit 100 and the thinning unit 200 with the protection tape 14 facing downwards.

Thus, to invert the substrate 10 upside down while the substrate 10 is being carried from the carry-in unit 30 to the corresponding processing unit (for example, the dicing unit 100 or the thinning unit 200), the transfer unit 58 is equipped with an inverting unit 65 configured to invert the substrate 10 which is held horizontally by the first holder 60. The inverting unit 65 includes, for example, a motor 66 and a timing belt configured to deliver a rotary motion of the motor 66 to the first holder 60. The inverting unit 65 inverts the substrate 10, which is horizontally held by the first holder 60, by rotating the first holder 60 by 180 degrees around a rotation axis extending in the X direction, for example.

The first holder 60 may have a plurality of (for example, three) attracting portions 63 for attracting the substrate 10 to hold the substrate 10 stably when the substrate 10 is inverted upside down. Further, though the first holder 60 vacuum-attracts the substrate 10 in the present exemplary embodiment, the first holder 60 may attract the substrate 10 electrostatically.

In addition, though the first holder 60 is used only for the transfer of the substrate 10 from the carry-in unit 30 to the first processing unit (for example, the dicing unit 100) in the present exemplary embodiment, the first holder 60 may also be used for a transfer of the substrate 10 from the dicing unit 100 to the thinning unit 200. That is, the first holder 60 may also be used to transfer the substrate 10 from one processing unit to another processing unit.

<Second Holder>

Figure 13:
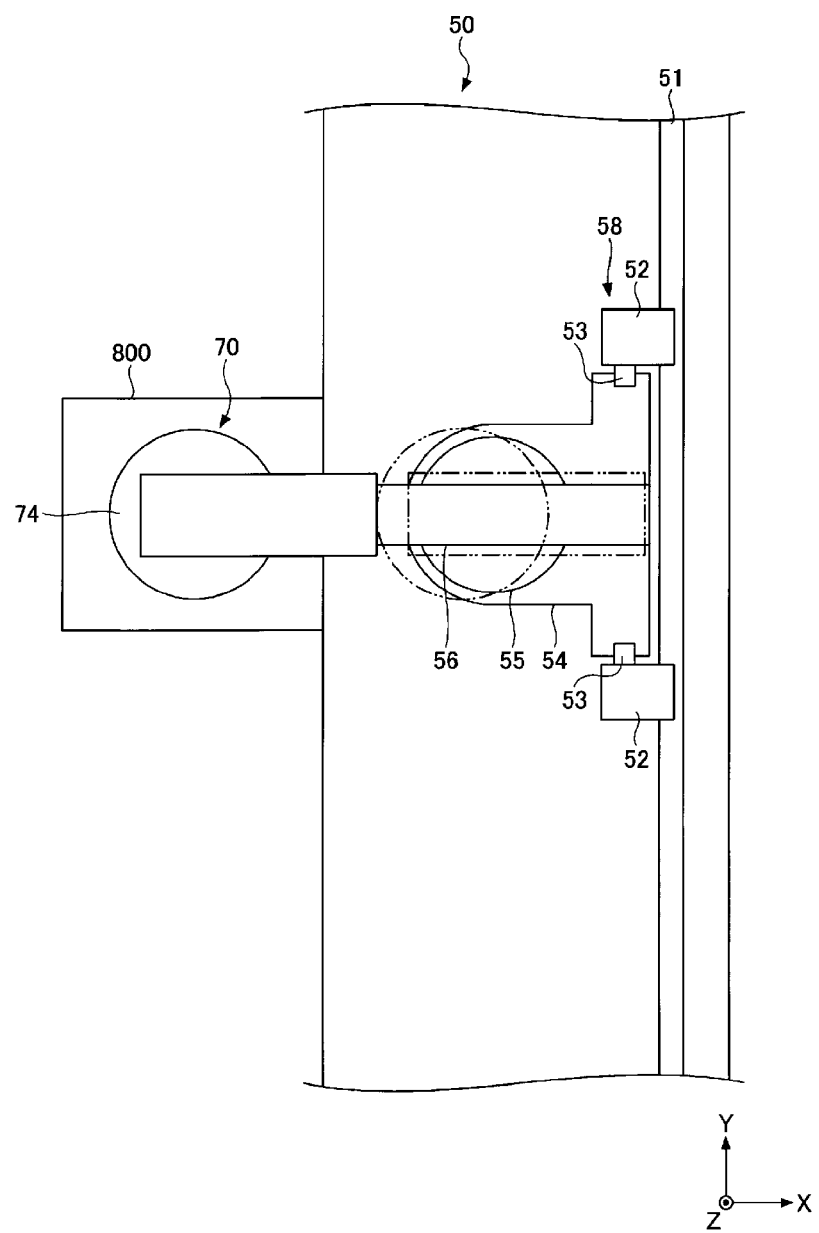
FIG. 13 is a plan view illustrating an operation in which the transfer unit according to the first exemplary embodiment carries the second holder into/from a cleaning unit.

Now, the second holder 70 will be explained with reference to FIG. 11 and FIG. 13. FIG. 13 is a plan view illustrating an operation in which the transfer unit according to the first exemplary embodiment carries the second holder into/from a cleaning unit.

The transfer unit 58 is equipped with, as illustrated in FIG. 13, the Y-axis slider 52 as the transfer base body configured to be moved along the transfer path 50; and the second holder 70 configured to be moved in the Y direction along with the Y-axis slider 52. The transfer unit 58 moves the second holder 70 in the X direction, the Z direction and the θ direction with respect to the Y-axis slider 52.

By way of example, the Z-axis guide 53 is fixed to the Y-axis slider 52. The rotary plate 55 is rotatably provided at the Z-axis slider 54 configured to be moved along the Z-axis guide 53. The X-axis guide 56 is provided at the rotary plate 55, and the second holder 70 is configured to be movable along the X-axis guide 56 independently from the first holder 60.

Basically, the X-axis guide 56 guides the second holder 70 in the X direction. However, as the X-axis guide 56 is rotated along with the rotary plate 55, it is capable of guiding the second holder 70 in a direction (for example, Y direction) different from the X direction.

Both the first holder 60 and the second holder 70 are mounted to the Y-axis slider 52. Accordingly, it is possible to hold the substrate 10 by selectively using, between the first holder 60 and the second holder 70, an appropriate one for a processing stage of the substrate 10.

The second holder 70 holds the substrate 10 when the substrate 10 is transferred from the dicing unit 100 to the mounting unit 500 via the thinning unit 200 and the ultraviolet irradiating unit 400, for example. The second holder 70 holds the substrate 10 whose strength is reduced by the processings such as the dicing and the thinning.

To suppress a deformation and a damage of the substrate 10, the second holder 70 has an attracting surface 71 (see FIG. 14) larger than the main surface (for example, the first main surface 11) of the substrate 10. Accordingly, the entire first main surface 11 of the substrate 10 can be maintained flat, so that the deformation and the damage of the substrate 10 can be suppressed.

Figure 14:
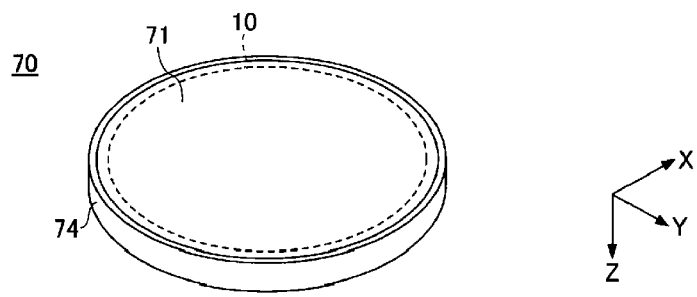
FIG. 14 is a perspective view illustrating the second holder according to the first exemplary embodiment.
Figure 15:
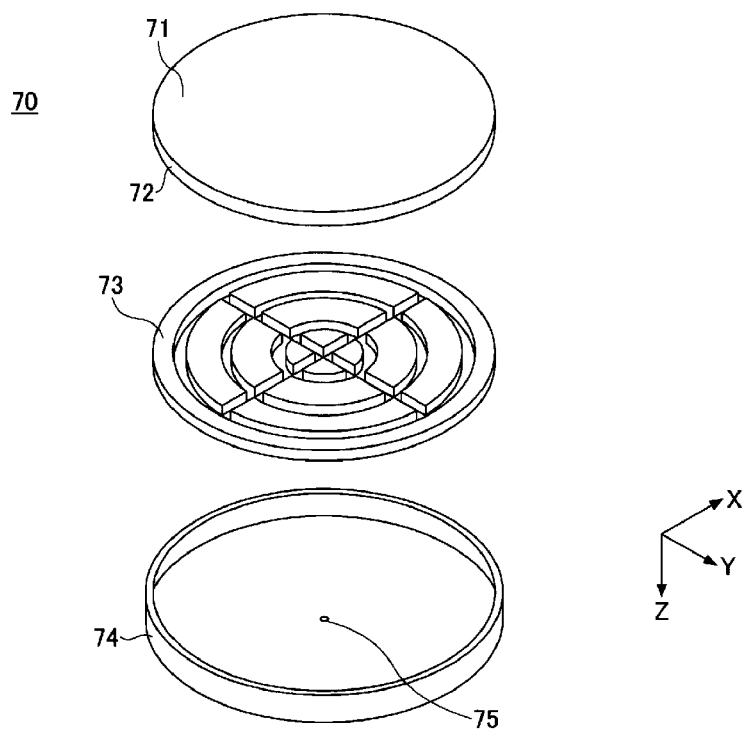
FIG. 15 is an exploded perspective view illustrating the second holder according to the first exemplary embodiment.

FIG. 14 is a perspective view illustrating the second holder according to the first exemplary embodiment. In FIG. 14, an outline of the substrate 10 held by the second holder 70 is illustrated by a dashed line. FIG. 15 is an exploded perspective view illustrating the second holder according to the first exemplary embodiment.

As depicted in FIG. 14 and FIG. 15, the second holder 70 is configured as, for example, a porous chuck. The second holder 70 includes a disk-shaped porous body 72; a disc 73 having, on a surface in contact with the porous body 72, suction grooves formed in concentric circles and suction grooves formed in a radial shape; and a base 74 accommodating therein the porous body 72 and the disc 73.

The base 74 has a suction hole 75 which communicates with the porous body 72 through the suction grooves of the disc 73, and a gas of this suction hole is sucked in by a suction source such as, by way of example, a vacuum pump. By generating a negative pressure in the porous body 72 by operating the suction source, the porous body 72 vacuum-attracts the substrate 10. Meanwhile, by stopping the operation of the suction source and opening the porous body 72 to the atmosphere, the porous body 72 releases the vacuum attraction of the substrate 10. When releasing the vacuum attraction, a positive pressure may be generated in the porous body 72.

Further, though the second holder 70 vacuum-attracts the substrate 10 in the present exemplary embodiment, the second holder 70 may attract the substrate 10 electrostatically.

The second holder 70 holds the substrate 10 after being thinned in the thinning unit 200. Thus, a processing residue caused by the thinning of the substrate 10 may adhere to the second holder 70.

To remove the processing residue adhering to the second holder 70 after the holding of the substrate 10 by the second holder 70 is released, the substrate processing system 1 is equipped with a cleaning unit 800 (see FIG. 3 and FIG. 13) configured to clean the second holder 70. The cleaning unit 800 is disposed adjacent to the transfer path 50. For example, with respect to the transfer path 50, the cleaning unit 800 is provided at the same side where the carry-in unit 30 and the carry-out unit 40 are provided.

To clean the second holder 70 in the cleaning unit 800, the transfer unit 58 moves the second holder 70 from a position indicated by a dashed double-dotted line in FIG. 13 to a position indicated by a solid line in FIG. 13, and the second holder 70 is cleaned in the cleaning unit 800. Thereafter, the transfer unit 58 returns the second holder 70 cleaned in the cleaning unit 800 to the position indicated by the dashed double-dotted line of FIG. 13.

Figure 16:
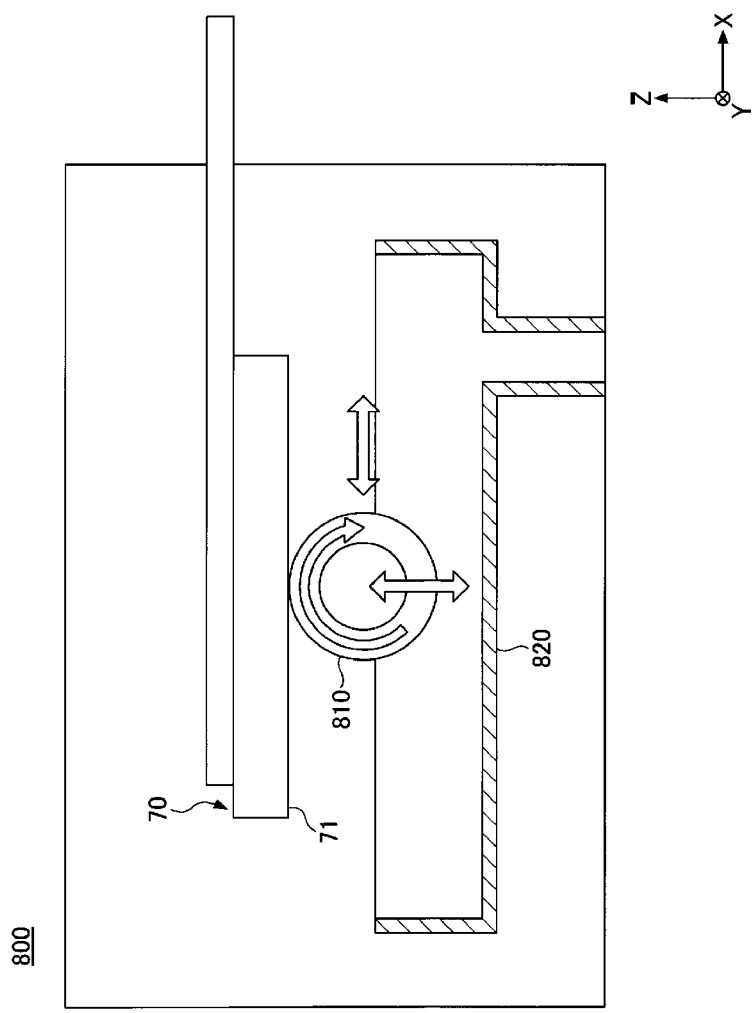
FIG. 16 is a diagram illustrating the cleaning unit according to the first exemplary embodiment.

FIG. 16 is a diagram illustrating the cleaning unit according to the first exemplary embodiment. The cleaning unit 800 has a brush 810 configured to be brought into contact with the second holder 70. Though the brush 810 in FIG. 16 is a roll brush, it can be a disc brush.

The brush 810 has a nozzle for supplying a cleaning liquid such as water. The nozzle may be provided separately from the brush 810 to supply the cleaning liquid to the brush 810. The cleaning liquid supplied to the brush 810 is collected by a recovery fan 820.

The cleaning unit 800 cleans the attracting surface 71 of the second holder 70 with the brush 810 by moving the brush 810 and the second holder 70 relative to each other as indicated by arrows in FIG. 16 while supplying the cleaning liquid to the brush 810. Accordingly, the processing residue adhering to the attracting surface 71 can be removed.

<Third Holder>

Figure 17:
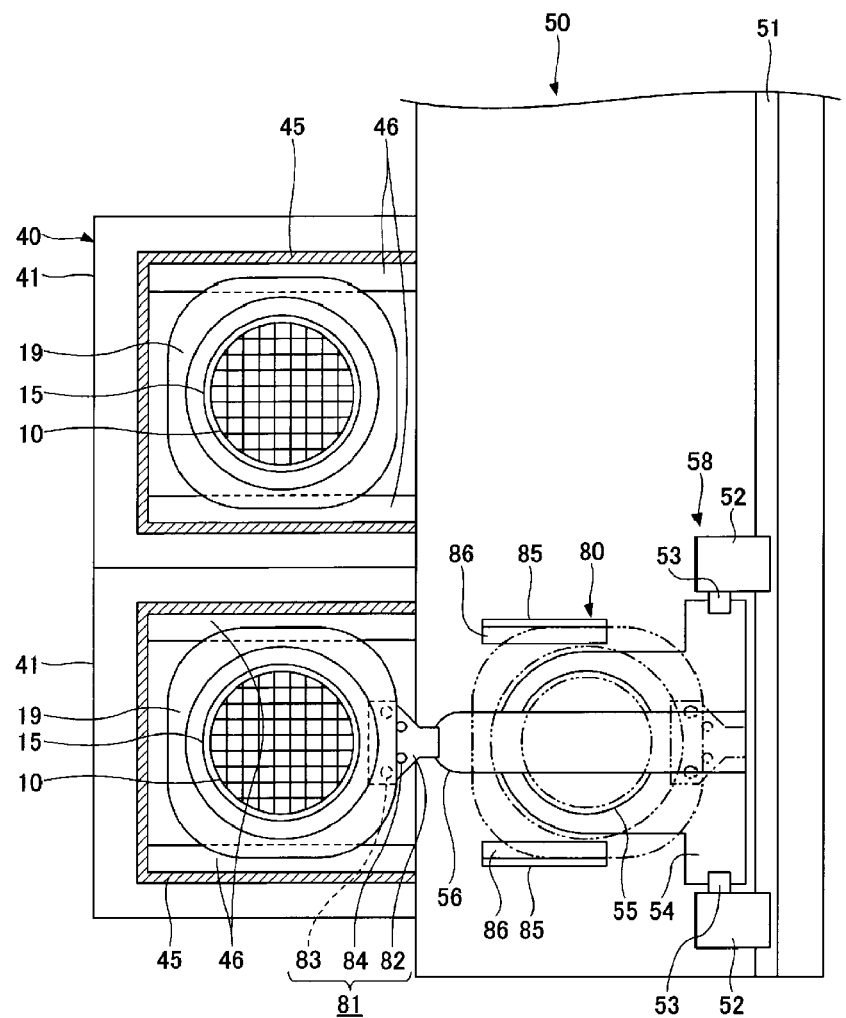
FIG. 17 is a plan view illustrating an operation in which the transfer unit according to the first exemplary embodiment accommodates a substrate after being processed into a carry-out cassette.

Now, the third holder 80 will be discussed with reference to FIG. 11 and FIG. 17. FIG. 17 is a plan view illustrating an operation in which the transfer unit according to the first exemplary embodiment accommodates the substrate after being processed into the carry-out cassette.

The transfer unit 58 is equipped with, as illustrated in FIG. 17, the Y-axis slider 52 as the transfer base body configured to be moved along the transfer path 50; and the third holder 80 configured to be moved in the Y direction along with the Y-axis slider 52. The transfer unit 58 moves the third holder 80 in the X direction, the Z direction and the θ direction with respect to the Y-axis slider 52.

By way of example, the Z-axis guide 53 is fixed to the Y-axis slider 52. The rotary plate 55 is rotatably provided at the Z-axis slider 54 configured to be moved along the Z-axis guide 53. The X-axis guide 56 is provided at the rotary plate 55, and the third holder 80 is configured to be movable along the X-axis guide 56 independently from the first holder 60 and the second holder 70.

Basically, the X-axis guide 56 guides the third holder 80 in the X direction. However, as the X-axis guide 56 is rotated along with the rotary plate 55, the X-axis guide 56 is capable of guiding the third holder 80 in a direction (for example, Y direction) different from the X direction.

Only a part (a grip member 81 to be describe later) of the third holder 80 may be movable along the X-axis guide 56. The rest part (a guide member 85 to be descried later) of the third holder 80 may be configured to be movable along the X-axis guide 56 or not to be movable along the X-axis guide 56.

The first holder 60, the second holder 70 and the third holder 80 are mounted to the Y-axis slider 52. Accordingly, it is possible to hold the substrate 10 by selectively using, among the first holder 60, the second holder 70 and the third holder 80, an appropriate one for a processing stage of the substrate 10.

The third holder 80 holds the substrate 10 when the substrate 10 is transferred from the mounting unit 500 to the carry-out unit 40 via the peeling unit 600 and the ID attaching unit 700, for example. The third holder 80 holds the substrate 10 which is mounted to the frame 19 with the adhesive tape 18 therebetween.

By holding the frame 19, the third holder 80 holds the substrate 10 which is bonded, in the opening of the frame 19, to the adhesive tape 18 mounted to the frame 19. The deformation and the damage of the substrate 10 after being subjected to the processings such as the dicing and the thinning can be suppressed.

The third holder 80 has the grip member 81 configured to hold the frame 19 to which the substrate 10 is mounted with the adhesive tape 18 therebetween; and guide members 85 on which the frame 19 held by the grip member 81 is placed.

The guide members 85 are moved along the transfer path 50 together with the grip member 81. Since the guide members 85 are not fixed, it is possible to support the frame 19 with the guide members 85 in a wide range of the transfer path 50, and bending of the frame 19 due to gravity can be suppressed. Thus, the deformation of the substrate 10 can be suppressed.

The grip member 81 holds an end portion of the frame 19 in the X direction between a pair of guide members 85 arranged at a distance therebetween in the Y direction, for example. Each guide member 85 has a L-shaped cross sectional shape, and comes into contact with a bottom surface of the frame 19 in the Z direction and end surfaces of the frame 19 in the Y direction when guiding the frame 19 in the X direction.

The transfer unit 58 is equipped with a moving mechanism configured to move the frame 19, which is held by the grip member 81, along the guide member 85 by moving the grip member 81 with respect to the guide member 85. The moving mechanism is composed of, by way of example, the X-axis guide 56 and a motor configured to move the grip member 81 along the X-axis guide 56.

To accommodate the substrate 10 after being processed in the carry-out cassette 45, the transfer unit 58 releases the holding of the substrate 10 with the grip member 81 by moving the grip member 81 from a position indicated by a dashed double-dotted line in FIG. 17 to a position indicated by a solid line in FIG. 17. Then, the transfer unit 58 returns the grip member 81 to the position indicated by the dashed double-dotted line of FIG. 17.

Figure 18:
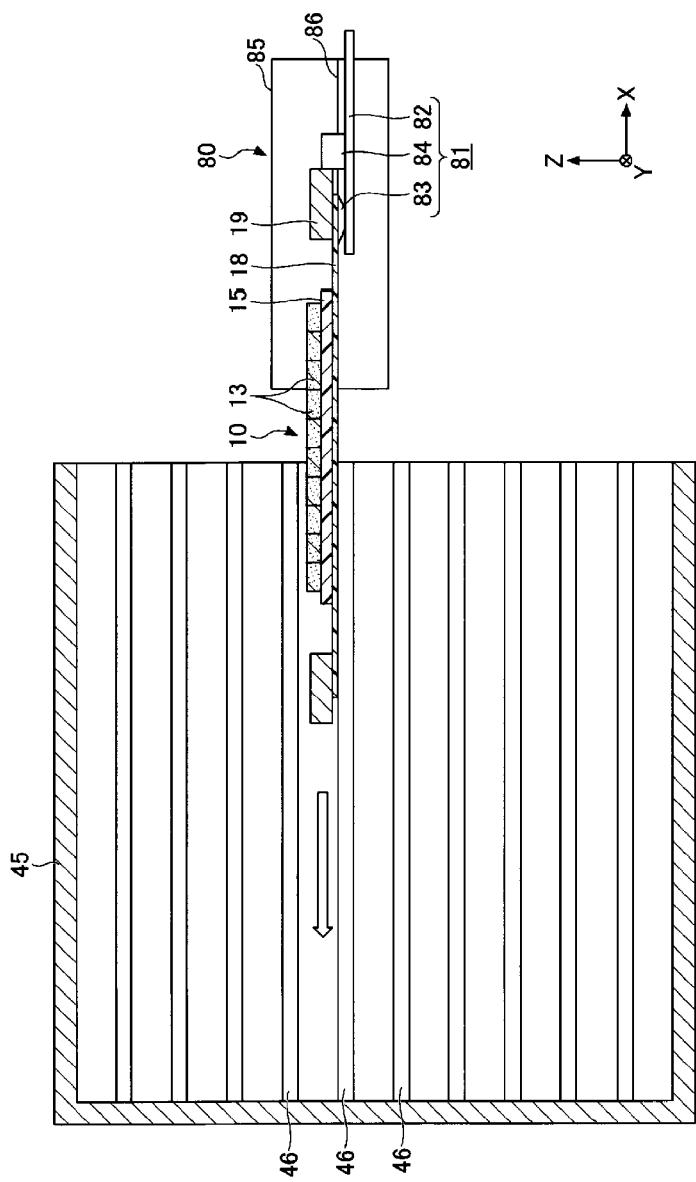
FIG. 18 is a cross sectional view illustrating an operation in which the transfer unit according to the first exemplary embodiment puts the substrate after being processed into the carry-out cassette.

Now, referring to FIG. 17 and FIG. 18, an operation of the transfer unit 58 to carry the substrate 10 after being processed into the carry-out cassette 45 will be described in detail. FIG. 18 is a cross sectional view illustrating an operation in which the transfer unit according to the first exemplary embodiment accommodates the substrate after being processed into the carry-out cassette.

First, the transfer unit 58 adjusts a position of the third holder 80 in the Z direction at an outside of the carry-out cassette 45, and places a placing surface 86 of the guide member 85, on which the frame 19 is placed, on a horizontal plane substantially level with top surfaces of the accommodation plates 46 of the carry-out cassette 45 in the Z direction. The frame 19 may be placed on the placing surface 86 of the guide member 85 with the adhesive tape 18.

Subsequently, by moving the grip member 81 in the X direction from the position indicated by the dashed double-dotted line of FIG. 17 to the position indicated by the solid line of FIG. 17 with respect to the guide members 85, the transfer unit 58 moves the frame 19, which is held by the grip member 81, along the guide members 85. Accordingly, the frame 19 is moved onto the accommodation plate 46 from the guide member 85, so that the substrate 10 is accommodated within the carry-out cassette 45.

Then, the transfer unit 58 releases the holding of the frame 19 by the grip member 81, and separates the grip member 81 from the frame 19 by moving the grip member 81 downwards. Thereafter, the transfer unit 58 moves the grip member 81 in the X direction from the position indicated by the solid line of FIG. 17 to the position indicated by the dashed double-dotted line of FIG. 17. Accordingly, the grip member 81 is returned back to the original position, and the operation of accommodating the substrate 10 after being processed into the carry-out cassette 45 is ended.

In the present exemplary embodiment, the frame 19 held with the grip member 81 is moved along the guide member 85 by moving the grip member 81 with respect to the guide member 85. Accordingly, as illustrated in FIG. 18, the frame 19 can be accommodated within the carry-out cassette 45 in the state that the guide member 85 is placed at the outside of the carry-out cassette 45. Since the guide member 85 is not inserted into the carry-out cassette 45 in this way, a size of the guide member 85 in the Z direction can be designed without needing to consider an internal structure of the carry-out cassette 45. Therefore, strength of the guide member 85 can be enhanced, so that bending (deformation) of the guide member 85 by gravity can be suppressed. As a result, the bending (deformation) of the frame 19 by the gravity can be suppressed, so that the deformation of the substrate 10 can be suppressed.

The grip member 81 includes, by way of example, a base member 82, a frame attracting member 83 and a frame pushing member 84. The base member 82 is formed to have a plate shape, and the frame attracting member 83 and the frame pushing member 84 are provided on a top surface of the base member 82.

The frame attracting member 83 has, for example, a suction hole, and a gas in the suction hole is sucked in by a suction source such as, but not limited to, a vacuum pump. By generating a negative pressure in the frame attracting member 83 by operating the suction source, the frame attracting member 83 vacuum-attracts the frame 19. Meanwhile, by stopping the operation of the suction source and opening the suction hole of the frame attracting member 83 to the atmosphere, the frame attracting member 83 releases the vacuum attraction of the frame 19. When the vacuum attraction is released, a positive pressure may be generated in the frame attracting member 83.

Further, though the frame attracting member 83 vacuum-attracts the frame 19 in the present exemplary embodiment, it may attracted the frame 19 electrostatically.

The frame attracting member 83 may be an elastic body such as rubber. The frame attracting member 83 may be elastically transformed to allow a step between the guide member 85 and the accommodation plates 46 when the frame 19 is loaded onto the accommodation plates 46 from the guide members 85. Thus, a tolerance error in the adjustment of the third holder 80 in the Z direction performed for the first time can be reduced.

The frame pushing member 84 pushes the end portion of the frame 19 in the X direction when the frame 19 is moved with respect to the guide member 85. Here, a plurality of frame pushing members 84 may be arranged in the Y direction at a regular distance therebetween to push the frame 19 in the X direction stably.

Furthermore, the grip member 81 has both the frame attracting member 83 and the frame pushing member 84 in the present exemplary embodiment. However, if the grip member 81 has at least one of the frame attracting member 83 or the frame pushing member 84, the frame 19 can be moved onto the accommodation plates 46 from the guide member 85.

In addition, though the grip member 81 holds the frame 19 from below in the present exemplary embodiment, the grip member 81 may hold the frame 19 from above. In this case, the grip member 81 and the guide member 85 holds the frame 19 therebetween in the vertical direction.

First Modification Example of First Exemplary Embodiment

The transfer unit 58 of the above-described exemplary embodiment always moves the first holder 60 and the second holder 70 along the transfer path 50 at the same time. In contrast, a transfer unit of a first modification example moves a first holder 60A and the second holder 70 along the transfer path 50 at the same time only when the second holder 70 is being attracted by the first holder 60A. The first holder 60A and the second holder 70 are mounted to the Y-axis slider 52. Below, description will be provided mainly focusing on distinctive features.

Figure 19A:
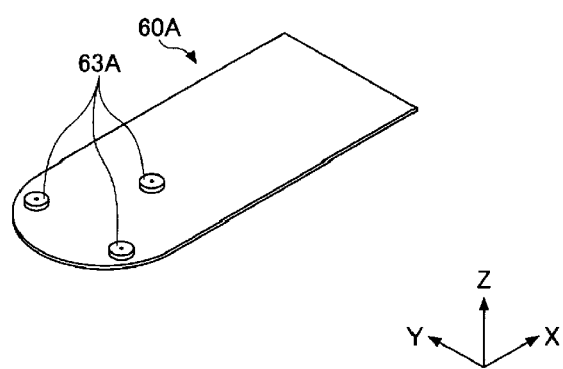
FIG. 19A and FIG. 19B are perspective views illustrating a first holder according to a first modification example of the first exemplary embodiment.
Figure 19B:
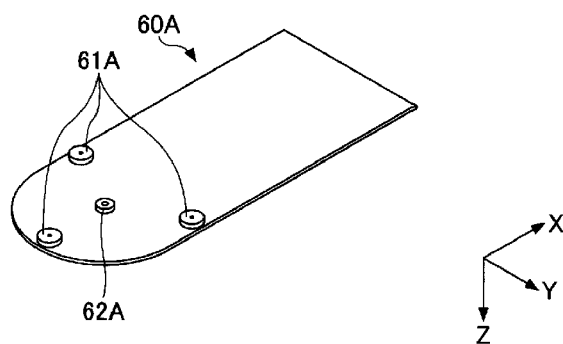
Figure 20A:
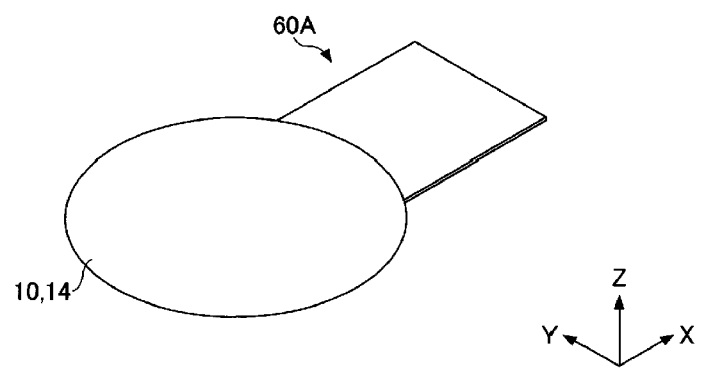
FIG. 20A and FIG. 20B are perspective views illustrating a substrate attracted to a third attracting portion of the first holder and a second holder attracted to a first attracting portion of the first holder according to the first modification example of the first exemplary embodiment.
Figure 20B:
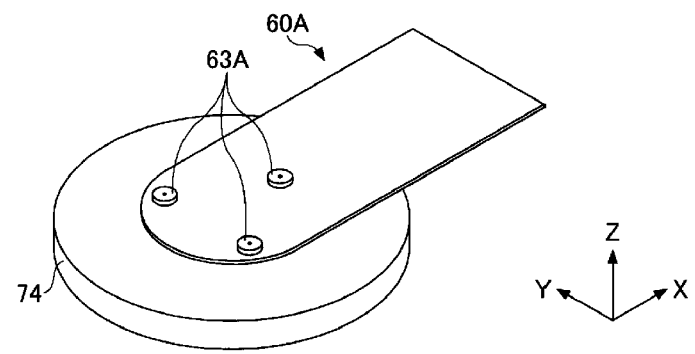
Figure 21:
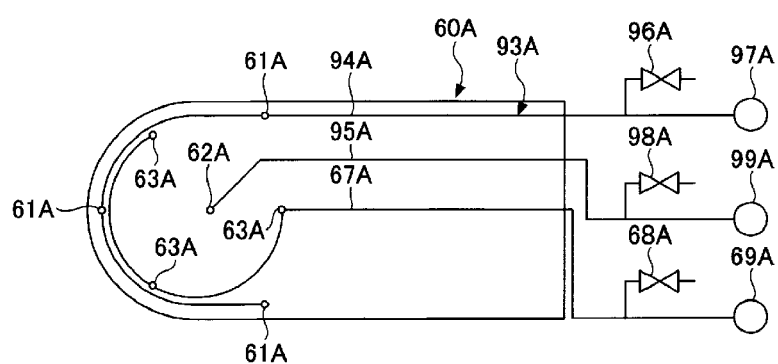
FIG. 21 is a plan view illustrating an attracting force supply of the first holder according to the first modification example of the first exemplary embodiment.

FIG. 19A is a perspective view illustrating a front side of the first holder according to the first modification example. FIG. 19B is a perspective view illustrating a rear side of the first holder according to the first modification example. FIG. 20A is a perspective view illustrating a substrate attracted by a third attracting portion of the first holder according to the first modification example. FIG. 20B is a perspective view illustrating the second holder attracted by a first attracting portion of the first holder according to the first modification example. FIG. 21 is a plan view illustrating an attracting force supply for the first holder according to the first modification example.

The first holder 60A includes, as depicted in FIG. 19B, first attracting portions 61A configured to attract the second holder 70 (see FIG. 20B) in a detachable manner; and a second attracting portion 62A configured to attract the substrate 10 via the second holder 70 attracted by the first attracting portions 61A. Accordingly, while the second holder 70 is being cleaned in the cleaning unit 800, the second holder 70 can be separated from the first holder 60A. Thus, without needing to wait for the end of the cleaning of the second holder 70, the first holder 60A can be moved along the transfer path 50, and the substrate 10 held by the first holder 60A can be transferred into one processing unit from the carry-in unit 30. Furthermore, the cleaning unit 800 is equipped with a delivery unit configured to receive the second holder 70 from the first holder 60A and hand over the second holder 70 to the first holder 60A.

The first holder 60A is equipped with, as illustrated in FIG. 21, an attracting force supply 93A configured to supply an attracting force to the first attracting portions 61A and the second attracting portion 62A independently. Accordingly, the substrate 10 can be attracted to the second holder 70 or the attraction of the substrate 10 to the second holder 70 can be released in the state that the second holder 70 is attracted to the first holder 60A.

The attracting force supply 93A has, for example, a first suction path 94A configured to generate a negative pressure in the first attracting portions 61A by sucking in the gas from suction holes of the first attracting portions 61A; and a second suction path 95A configured to generate a negative pressure in the second attracting portion 62A by sucking in the gas from a suction hole of the second attracting portion 62A. As the first suction path 94A generates the negative pressure in the first attracting portions 61A, the first attracting portions 61A vacuum-attract the second holder 70. Further, as the second suction path 95A generates the negative pressure in the second attracting portion 62A, the second holder 70 vacuum-attracted to the first attracting portions 61A vacuum-attracts the substrate 10.

The first suction path 94A is connected with a first suction source 97A via a first pipeline which is equipped with a first leak valve 96A or the like. A vacuum pump or the like is used as the first suction source 97A. Further, by closing the first leak valve 96A and operating the first suction source 97A, the negative pressure is generated in the first attracting portions 61A. Meanwhile, by opening the first leak valve 96A and stopping the operation of the first suction source 97A, the negative pressure generated in the first attracting portions 61A is removed. Furthermore, it may be possible to stop the operation of the first suction source 97A and generate a positive pressure in the first attracting portions 61A.

The second suction path 95A is connected with a second suction source 99A via a second pipeline which is equipped with a second leak valve 98A or the like. A vacuum pump or the like is used as the second suction source 99A. Further, by closing the second leak valve 98A and operating the second suction source 99A, the negative pressure is generated in the second attracting portion 62A. Meanwhile, by opening the second leak valve 98A and stopping the operation of the second suction source 99A, the negative pressure generated in the second attracting portion 62A is removed. Furthermore, it may be possible to stop the operation of the second suction source 99A and generate a positive pressure in the second attracting portion 62A.

When the first attracting portions 61A are attracting the second holder 70, the suction hole of the second attracting portion 62A communicates with the suction hole 75 (see FIG. 14) of the second holder 70. In this state, if the negative pressure is generated in the second attracting portion 62A, a negative pressure is generated in the porous body 72 (see FIG. 14) of the second holder 70, so that the substrate 10 is vacuum-attracted to the porous body 72. Then, if the negative pressure generated in the second attracting portion 62A is removed, the vacuum attraction of the substrate 10 is released.

Here, when transferring the substrate 10 from the carry-in unit 30 into one processing unit, the first holder 60A may attract the substrate 10 by the first attracting portions 61A. In the present exemplary embodiment, however, the substrate 10 (see FIG. 20A) is attracted by third attracting portions 63A (see FIG. 19A) which are provided separately from the first attracting portions 61A. In this case, as illustrated in FIG. 21, the attracting force supply 93A has, for example, a third suction path 67A configured to generate a negative pressure in the third attracting portions 63A by sucking in the gas from suction holes of the third attracting portions 63A. As the third suction path 67A generates the negative pressure in the third attracting portions 63A, the third attracting portions 63A vacuum-attracts the substrate 10.

The third suction path 67A is connected with a third suction source 69A via a third pipeline which is equipped with a third leak valve 68A or the like. A vacuum pump or the like is used as the third suction source 69A. By closing the third leak valve 68A and operating the third suction source 69A, the negative pressure is generated in the third attracting portions 63A. Meanwhile, by opening the third leak valve 68A and stopping the operation of the third suction source 69A, the negative pressure generated in the third attracting portions 63A is removed. Furthermore, it may be possible to stop the operation of the third suction source 69A and generate a positive pressure in the third attracting portions 63A.

Like the transfer unit 58 of the above-described first exemplary embodiment, the transfer unit of the present modification example may be equipped with the inverting unit 65 (see FIG. 11) configured to invert the substrate 10, which is held horizontally by the first holder 60A, such that the substrate 10 can be inverted while the substrate 10 is being transferred from the carry-in unit 30 into one processing unit. The inverting unit 65 may invert the substrate 10 horizontally held by the second holder 70 upside down with the first holder 60A therebetween.

Furthermore, though the first attracting portions 61A vacuum-attract the second holder 70 in the present exemplary embodiment, the first attracting portions 61A may attract the second holder 70 electrostatically. In addition, though the second attracting portion 62A vacuum-attracts the substrate 10 via the second holder 70 attracted by the first attracting portions 61A in the present exemplary embodiment, the second attracting portion 62A may attract the substrate 10 electrostatically.

Second Modification Example of First Exemplary Embodiment

The transfer unit of the first modification example detachably attracts the second holder 70 to the first holder 60A which is moved along with the Y-axis slider 52. In a second modification example, however, a transfer unit attracts a first holder 60B and the second holder 70 selectively to a replacement unit 90B which is moved along with the Y-axis slider 52. The first holder 60B and the second holder 70 are mounted to the Y-axis slider 52. Below, description will be provided mainly focusing on distinctive features.

Figure 22A:
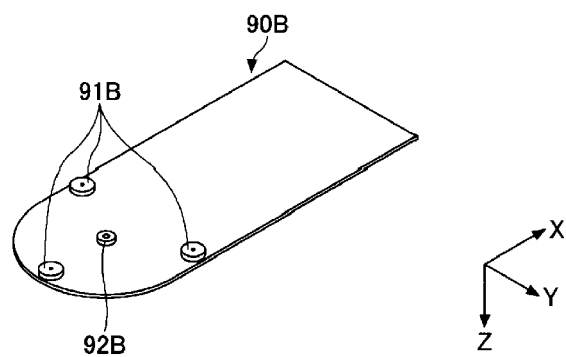
FIG. 22A and FIG. 22B are perspective views illustrating a replacement member and a first holder attracted to the replacement member according to a second modification example of the first exemplary embodiment.
Figure 22B:
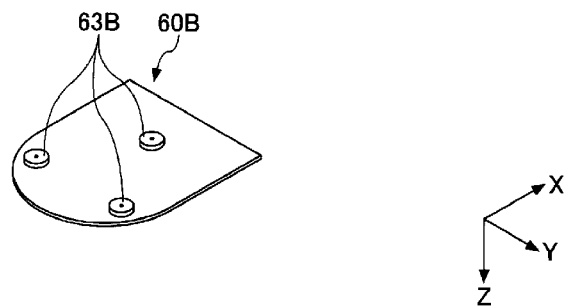
Figure 23A:
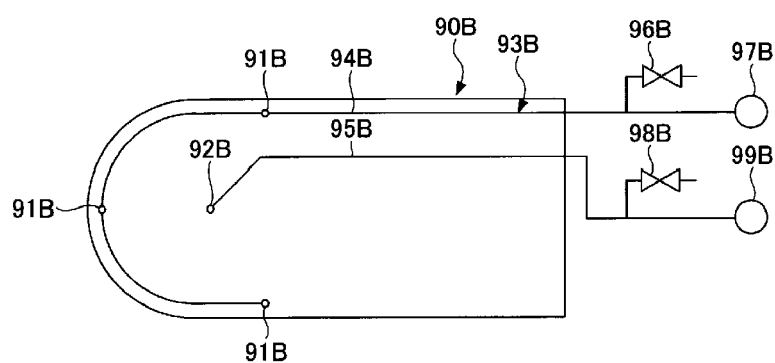
FIG. 23A and FIG. 23B are plan views illustrating a suction path of the replacement member and a suction path of the first holder attracted to the replacement member according to the second modification example of the first exemplary embodiment.
Figure 23B:
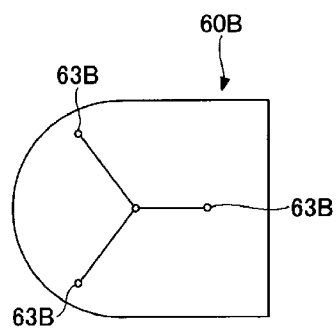

FIG. 22A is a perspective view illustrating the replacement unit according to the second modification example. FIG. 22B is a perspective view illustrating the first holder attracted to the replacement unit according to the second modification example. FIG. 23A is a plan view illustrating a suction path of the replacement unit according to the second modification example. FIG. 23B is a plan view illustrating a suction path of the first holder attracted to the replacement unit of the second modification example.

The replacement unit 90B has, as depicted in FIG. 22A, first attracting portions 91B configured to attract the first holder 60B and the second holder 70 selectively; and a second attracting portion 92B configured to attract the substrate 10 via the first holder 60B or the second holder 70 attracted by the first attracting portions 91B. Accordingly, while the second holder 70 is being cleaned in the cleaning unit 800, the second holder 70 can be separated from the replacement unit 90B. Thus, without needing to wait for the end of the cleaning of the second holder 70, the first holder 60B attracted to the replacement unit 90B can be moved along the transfer path 50, and the substrate 10 held by the first holder 60B can be transferred from the carry-in unit 30 into one processing unit. Furthermore, while the first holder 60B is being cleaned in the cleaning unit 800, the first holder 60B can be separated from the replacement unit 90B. Thus, without needing to wait for the end of the cleaning of the first holder 60B, the second holder 70 attracted to the replacement unit 90B can be moved along the transfer path 50, and the substrate 10 held by the second holder 70 can be transferred from the one processing unit to another processing unit. Furthermore, the cleaning unit 800 is equipped with a delivery unit configured to receive the first holder 60B and the second holder 70 from the replacement unit 90B and hand over the first holder 60B and the second holder 70 to the replacement unit 90B.

The replacement unit 90B is equipped with an attracting force supply 93B (see FIG. 23A) configured to supply an attracting force to the first attracting portions 91B and the second attracting portion 92B independently. Accordingly, the substrate 10 can be attracted to the first holder 60B or the attraction of the substrate 10 to the first holder 60B can be released in the state that the first holder 60B is attracted to the replacement unit 90B. Further, the substrate 10 may be attracted to the second holder 70 or the attraction of the substrate 10 to the second holder 70 can be released in the state that the second holder 70 is attracted to the replacement unit 90B.

The attracting force supply 93B has, for example, a first suction path 94B configured to generate a negative pressure in the first attracting portions 91B by sucking in the gas from suction holes of the first attracting portions 91B; and a second suction path 95B configured to generate a negative pressure in the second attracting portion 92B by sucking in the gas from a suction hole of the second attracting portion 92B. As the first suction path 94B generates the negative pressure in the first attracting portions 91B, the first attracting portions 91B vacuum-attract the first holder 60B or the second holder 70. Further, as the second suction path 95B generates the negative pressure in the second attracting portion 92B, the first holder 60B or the second holder 70 vacuum-attracted to the first attracting portions 91B vacuum-attracts the substrate 10.

The first suction path 94B is connected with a first suction source 97B via a first pipeline which is equipped with a first leak valve 96B or the like. A vacuum pump or the like is used as the first suction source 97B. By closing the first leak valve 96B and operating the first suction source 97B, the negative pressure is generated in the first attracting portions 91B. Meanwhile, by opening the first leak valve 96B and stopping the operation of the first suction source 97B, the negative pressure generated in the first attracting portions 91B is removed. Furthermore, it may be possible to stop the operation of the first suction source 97B and generate a positive pressure in the first attracting portions 91B.

The second suction path 95B is connected with a second suction source 99B via a second pipeline which is equipped with a second leak valve 98B or the like. A vacuum pump or the like is used as the second suction source 99B. By closing the second leak valve 98B and operating the second suction source 99B, the negative pressure is generated in the second attracting portion 92B. Meanwhile, by opening the second leak valve 98B and stopping the operation of the second suction source 99B, the negative pressure generated in the second attracting portion 92B is removed. Furthermore, it may be possible to stop the operation of the second suction source 99B and generate a positive pressure in the second attracting portion 92B.

When the first attracting portions 91B are attracting the first holder 60B, the suction hole of the second attracting portion 92B communicates with suction holes of third attracting portions 63B (see FIG. 23B) of the first holder 60B. In this state, if the negative pressure is generated in the second attracting portion 92B, a negative pressure is generated in the third attracting portions 63B, so that the substrate 10 is vacuum-attracted to the third attracting portions 63B. Then, if the negative pressure generated in the second attracting portion 92B is removed, the vacuum attraction of the substrate 10 is released.

Further, when the first attracting portions 91B are attracting the second holder 70, the suction hole of the second attracting portion 92B communicates with the suction hole 75 (see FIG. 14) of the second holder 70. In this state, if the negative pressure is generated in the second attracting portion 92B, a negative pressure is generated in the porous body 72 (see FIG. 14) of the second holder 70, so that the substrate 10 is vacuum-attracted to the porous body 72. Then, if the negative pressure generated in the second attracting portion 92B is removed, the vacuum attraction of the substrate 10 is released.

Like the transfer unit 58 of the above-described first exemplary embodiment, the transfer unit of the present modification example may be equipped with the inverting unit 65 (see FIG. 11) configured to invert the substrate 10, which is held horizontally by the first holder 60B, such that the substrate 10 can be inverted while the substrate 10 is being transferred from the carry-in unit 30 into one processing unit. The inverting unit 65 may invert the substrate 10 horizontally held by the second holder 70.

Furthermore, though the first attracting portions 91B vacuum-attract the first holder 60B and the second holder 70 selectively in the present exemplary embodiment, the first attracting portions 91B may attract the first holder 60B and the second holder 70 electrostatically. Likewise, though the second attracting portion 92B vacuum-attracts the substrate 10 via the first holder 60B or the second holder 70 attracted to the first attracting portions 91B, the second attracting portion 92B may attract the substrate 10 electrostatically.

Third Modification Example of First Exemplary Embodiment

In the transfer unit 58 according to the first exemplary embodiment, the Y-axis slider 52 to which the first holder 60 and the second holder 70 are mounted and the Y-axis slider 52 to which the third holder 80 is mounted are one and same. This is the same in the first modification example and the second modification example. In contrast, in a transfer unit 58C according to a third modification example, a Y-axis slider 52 to which the first holder 60 and the second holder 70 are mounted and a Y-axis slider 52 to which the third holder 80 is mounted are different. Below, distinctive features will be mainly described.

Figure 24:
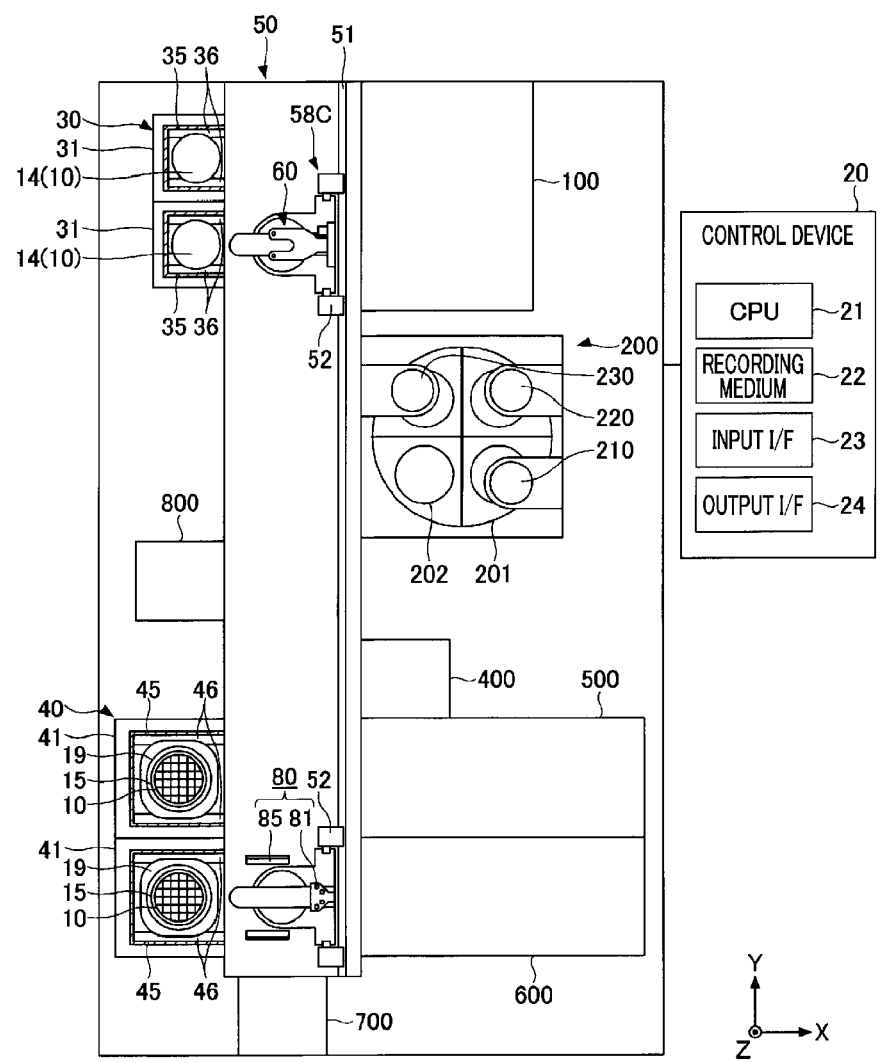
FIG. 24 is a plan view illustrating a substrate processing system equipped with a transfer unit according to a third modification example of the first exemplary embodiment.

FIG. 24 is a plan view illustrating a substrate processing system equipped with the transfer unit according to the third modification example. In FIG. 24, among the first holder 60, the second holder 70 and the third holder 80, only the first holder 60 and the third holder 80 are shown, and illustration of the second holder 70 is omitted.

Like the transfer unit 58 of the above-described first exemplary embodiment, the transfer unit 58C of the third modification example is equipped with the first holder 60, the second holder 70 and the third holder 80.

The first holder 60 and the second holder 70 are moved along with the Y-axis slider 52. Accordingly, it is possible to hold the substrate 10 by selectively using, between the first holder 60 and the second holder 70, an appropriate one for a processing stage of the substrate 10. The first holder 60 and the second holder 70 may be moved at the same time in the Y direction, the Z direction and the θ direction, and be moved independently in the X direction.

Further, the first holder 60 and the second holder 70 need to be moved along with the Y-axis slider 52. Here, as in the first modification example, the second holder 70 may be detachably attracted to the first holder 60A. Further, as in the second modification example, the first holder 60B and the second holder 70 may be selectively attracted to the replacement unit 90B.

The first holder 60 and the second holder 70 holds a substrate 10 before being mounted to the frame 19, whereas the third holder 80 holds a substrate 10 after being mounted to the frame 19. Thus, a region where the substrate 10 is transferred by the first holder 60 and the second holder 70 and a region where the substrate 10 is transferred by the third holder 80 are different except a region near the mounting unit 500.

Accordingly, unlike in the transfer unit 58 of the above-described exemplary embodiment, a Y-axis slider 52 to which the first holder 60 and the second holder 70 are mounted and a Y-axis slider 52 to which the third holder 80 is mounted are different in the transfer unit 58C of the present modification example. Since the first holder 60/the second holder 70 and the third holder 80 can be moved independently in the Y direction, the substrate 10 before being mounted to the frame 19 and the substrate 10 after being mounted to the frame 19 can be transferred at the same time.

Second Exemplary Embodiment

In the above-described first exemplary embodiment and modification examples thereof, the substrate 10 before being thinned and before being mounted to the frame 19 with the adhesive tape 18 therebetween is accommodated in the carry-in cassette 35. In a second exemplary embodiment, a substrate 10 before being thinned and after being mounted to the frame 19 with the protection tape 14 therebetween is accommodated in a carry-in cassette 35D. Below, distinctive features will be mainly described.

<Substrate Before being Processed by Substrate Processing System>

Figure 25:
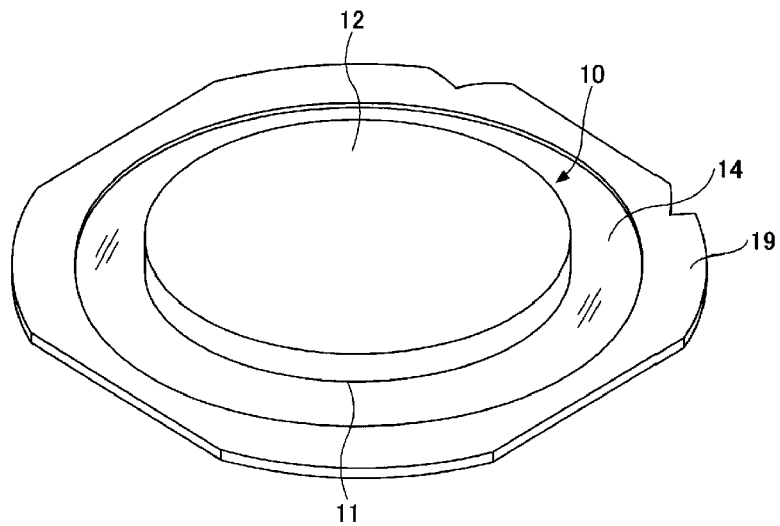
FIG. 25 is a perspective view illustrating a substrate before being processed by a substrate processing system according to a second exemplary embodiment.

FIG. 25 is a perspective view illustrating a substrate before being processed by a substrate processing system according to the second exemplary embodiment. A protection tape 14 is bonded to a first main surface 11 of a substrate 10. The protection tape 14 protects the first main surface 11 of the substrate 10 while processings such as dicing and thinning are being performed, thus protecting elements, circuits, terminals and so forth which are formed on the first main surface 11 in advance.

The protection tape 14 is attached to an annular frame 19 to cover an opening of the frame 19 and bonded to the substrate 10 in the opening of the frame 19. Accordingly, it is possible to transfer the substrate 10 while holding the frame 19, so that handling of the substrate 10 can be improved.

<Substrate after being Processed by Substrate Processing System>

Figure 26:
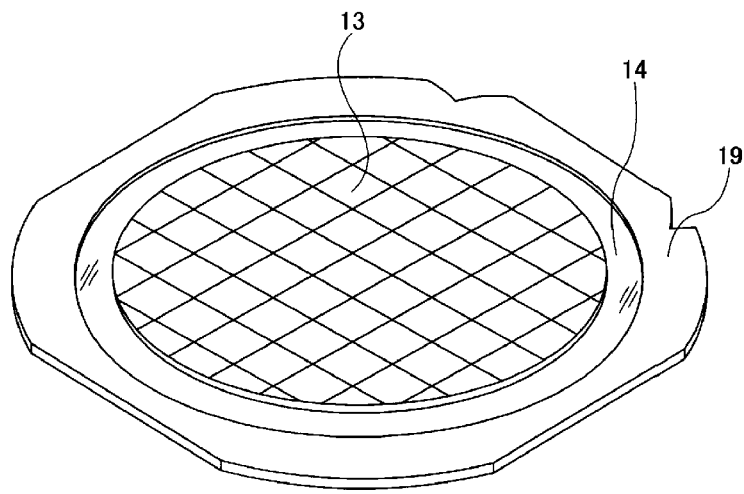
FIG. 26 is a perspective view illustrating the substrate after being processed by the substrate processing system according to the second exemplary embodiment.

FIG. 26 is a perspective view illustrating a substrate after being processed by the substrate processing system according to the second exemplary embodiment. The substrate 10 is diced and thinned. The substrate 10 after being processed is divided into a multiple number of chips 13 and mounted to the frame 19 with the protection tape 14 therebetween.

Further, though the substrate 10 after being processed is mounted to the frame 19 with the protection tape 14 therebetween in the present exemplary embodiment, the substrate 10 may be mounted to the frame 19 with an adhesive tape 18 (see FIG. 2) therebetween, the same as in the above-described first exemplary embodiment and modification examples thereof.

The adhesive tape 18 is bonded to a second main surface 12 of the substrate 10 after being thinned. A DAF 15 (see FIG. 2) may be provided between the adhesive tape 18 and the substrate 10. Then, the protection tape 14 is peeled off the first main surface 11 of the substrate 10.

The frame 19 to which the adhesive tape 18 is attached and the frame 19 to which the protection tape 14 is attached may be same or different. In the former, the number of the used frame 19 can be reduced. In this case, after the thinning of the substrate is performed, the frame 19 is sufficiently cleaned, so that a processing residue is removed from the frame 19. Then, the adhesive tape 18 is attached to the frame 19. Meanwhile, in the latter, a process of cleaning the frame 19 after the thinning of the substrate need not be performed.

<Substrate Processing System>

Figure 27:
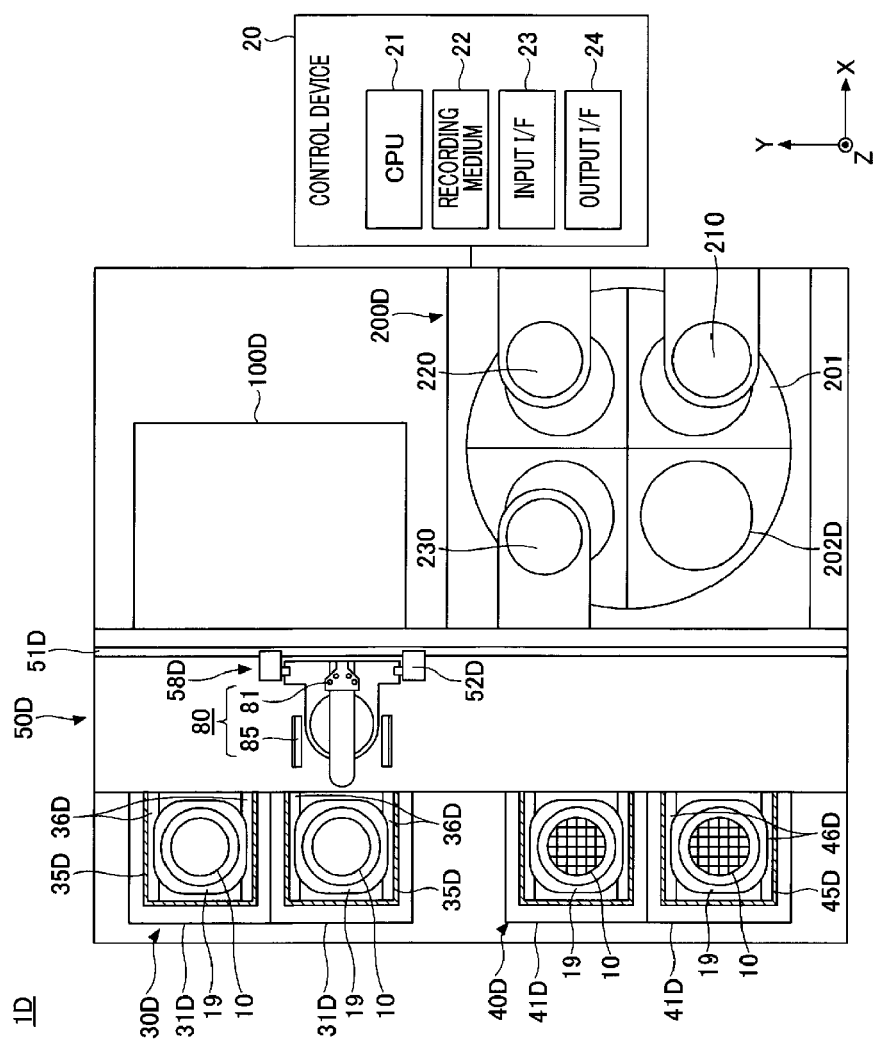
FIG. 27 is a plan view illustrating the substrate processing system according to the second exemplary embodiment.

FIG. 27 is a plan view illustrating the substrate processing system according to the second exemplary embodiment. In FIG. 27, carry-in cassettes 35D and carry-out cassettes 45D are cut out so that the inside of the carry-in cassettes 35D and the inside of the carry-out cassettes 45D are shown.

A substrate processing system 1D performs various processings such as dicing of the substrate 10, thinning of the substrate 10, and so forth. The substrate processing system 1D is equipped with a controller 20, a carry-in unit 30D, a carry-out unit 40D, a transfer path 50D, a transfer unit 58D, and various kinds of processing units. The processing units are not particularly limited. By way of example, the processing units include a dicing unit 100D and a thinning unit 200D.

The carry-in cassettes 35D each accommodating therein substrates 10 before being processed are carried into the carry-in unit 30D. Each carry-in cassette 35D accommodates therein a multiple number of substrates 10 before being thinned while maintaining a regular distance therebetween in the Z direction. Here, each substrate 10 is already mounted to the frame 19 with the protection tape 14 therebetween.

To accommodate the multiple number of substrates 10 at the regular distance therebetween in the Z direction, the carry-in cassette 35D has multiple pairs of horizontally placed accommodation plates 36D arranged in the Z direction at a regular distance therebetween. Each pair of accommodation plates 36D supports both ends of the frame 19 in the Y direction, as illustrated in FIG. 27.

The carry-in unit 30D is equipped with multiple placing plates 31D on which the carry-in cassettes 35D are placed. The placing plates 31D are arranged in a row in the Y direction. The number of the placing plates 31D is not limited to the shown example.

The carry-out cassettes 45D each accommodating therein the substrates 10 after being processed are carried out from the carry-out unit 40D. Each carry-out cassette 45D accommodates therein a multiple number of substrates 10 after being thinned while maintaining a regular distance therebetween in the Z direction. Here, each substrate 10 is accommodated while being mounted to the frame 19 with the protection tape 14 therebetween.

To accommodate the multiple number of substrates 10 at the regular distance therebetween in the Z direction, the carry-out cassette 45D has multiple pairs of horizontally placed accommodation plates 46D arranged in the Z direction at a regular distance therebetween. Each pair of accommodation plates 46D supports both ends of the frame 19 in the Y direction, as illustrated in FIG. 27.

The carry-out unit 40D is equipped with multiple placing plates 41D on which the carry-out cassettes 45D are placed. The placing plates 41D are arranged in a row in the Y direction. The number of the placing plates 41D is not limited to the shown example.

The transfer path 50D is a path through which the transfer unit 58D transfers the substrate 10 into/from the carry-in unit 30D, the carry-out unit 40D and the plurality of processing units, and extends in, for example, the Y direction. A Y-axis guide 51D extending in the Y direction is provided in the transfer path 50D, and a Y-axis slider 52D is configured to be movable along the Y-axis guide 51D.

The transfer unit 58D is configured to hold the substrate 10 and be moved along the transfer path 50D to deliver the substrate 10 to the carry-in unit 30D, the carry-out unit 40D and the plurality of processing units. The transfer unit 58D includes the Y-axis slider 52D as a transfer base body, and so forth.

The carry-in unit 30D, the carry-out unit 40D and the plurality of processing units are disposed adjacent to the transfer path 50D. By way of example, the transfer path 50D extends in the Y direction, and the carry-in unit 30D and the carry-out unit 40D are provided adjacent to one side of the transfer path 50D in the X direction, and the dicing unit 100D and the thinning unit 200D are provided adjacent to the opposite side of the transfer path 50D in the X direction.

According to the present exemplary embodiment, the carry-in unit 30D and the plurality of processing units are disposed adjacent to the transfer path 50D. Accordingly, the transfer unit 58D is capable of delivering the substrate 10 to the carry-in unit 30D and the plurality of processing units. Thus, the transfer unit 58D can be multi-functionalized and a work amount of the transfer unit 58D can be increased. Therefore, an operating rate of the transfer unit 58D can be improved.

Further, according to the present exemplary embodiment, the carry-out unit 40D is also disposed adjacent to the transfer path 50D. Accordingly, the transfer unit 58D is capable of delivering the substrate 10 to the carry-out unit 40D. Thus, the transfer unit 58D can be further multi-functionalized and the work amount of the transfer unit 58D can be further increased. Therefore, the operating rate of the transfer unit 58D can be further improved. Moreover, since the plurality of processing units and the carry-out unit 40D are disposed adjacent to the transfer path 50D, if there is an abnormal substrate 10 in one processing unit, this abnormal substrate 10 can be transferred to the carry-out unit 40D promptly without being transferred to another processing unit.

Further, the layout and the number of the processing units are not limited to the example shown in FIG. 27 but can be selected as required. Further, the plurality of processing units may be dispersed or combined into required units. Now, the individual processing units will be described.

<Dicing Unit>

Figure 28:
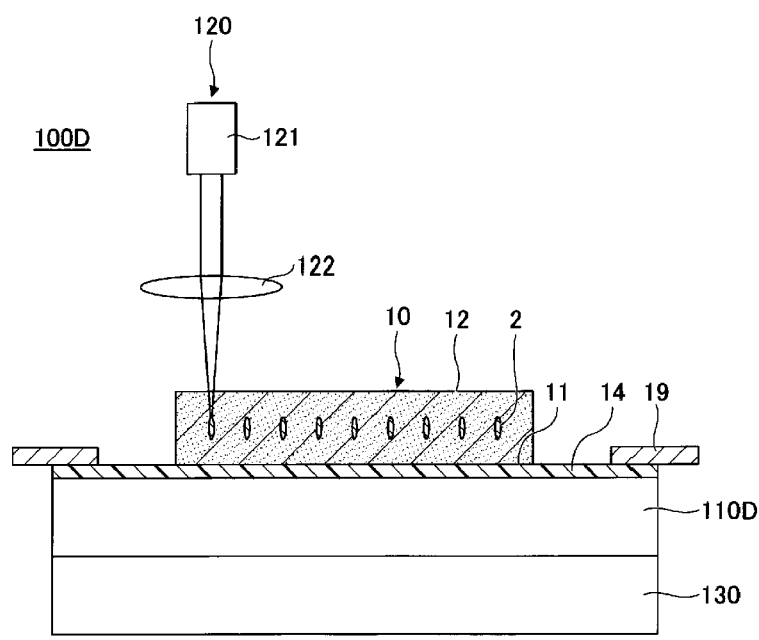
FIG. 28 is a diagram illustrating a dicing unit according to the second exemplary embodiment.

FIG. 28 is a diagram illustrating the dicing unit according to the second exemplary embodiment. A dicing unit 100D performs dicing of the substrate 10. A configuration of the dicing unit 100D is the same as the configuration of the dicing unit 100 of the first exemplary embodiment except that a dicing table 110D holds a frame 19 with a protection tape 14 therebetween, as illustrated in FIG. 28.

Further, though the dicing unit 100D is provided as a part of the substrate processing system 1D in the present exemplary embodiment, the dicing unit 100D may be provided at an outside of the substrate processing system 1D. In such a case, the substrate 10 is carried into the carry-in unit 30D from the outside after being diced, and is then transferred into the thinning unit 200D instead of the dicing unit 100D after being taken out from the carry-in cassette 35D in the carry-in unit 30D.

<Thinning Unit>

Figure 29:
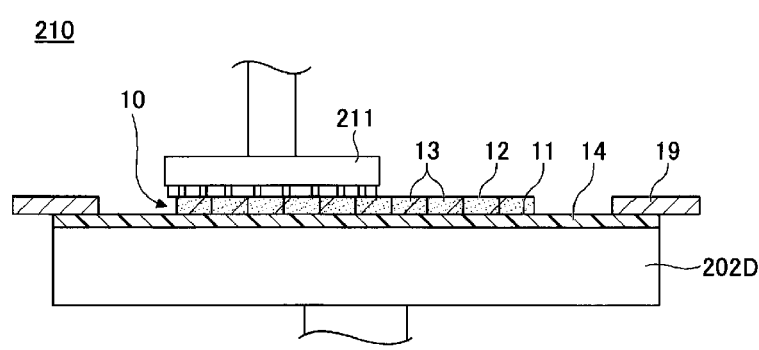
FIG. 29 is a diagram illustrating a rough grinding unit of a thinning unit according to the second exemplary embodiment.

The thinning unit 200D (see FIG. 27) is configured to thin the substrate 10 by processing a second main surface 12 of the diced substrate 10, which is opposite to a first main surface 11 protected by the protection tape 14. A configuration of the thinning unit 200D is the same as the configuration of the thinning unit 200 of the first exemplary embodiment except that a chuck table 202D holds the frame 19 with the protection tape 14 therebetween, as illustrated in FIG. 29.

When viewed from a direction perpendicular to an attracting surface (for example, a top surface in FIG. 29) of the chuck table 202D, a periphery of the frame 19 is located at an outside of the attracting surface of the chuck table 202D. The attracting surface of the chuck table 202D is covered with the protection tape 14 attached to the frame 19 larger than the corresponding attracting surface. Accordingly, adhesion of foreign substances such as a processing residue to the attracting surface of the chuck table 202D can be suppressed, and a cleaning process of washing the foreign substances away need not be performed. Therefore, a burden in replacing the substrate 10 can be reduced.

<Substrate Processing Method>

Figure 30:
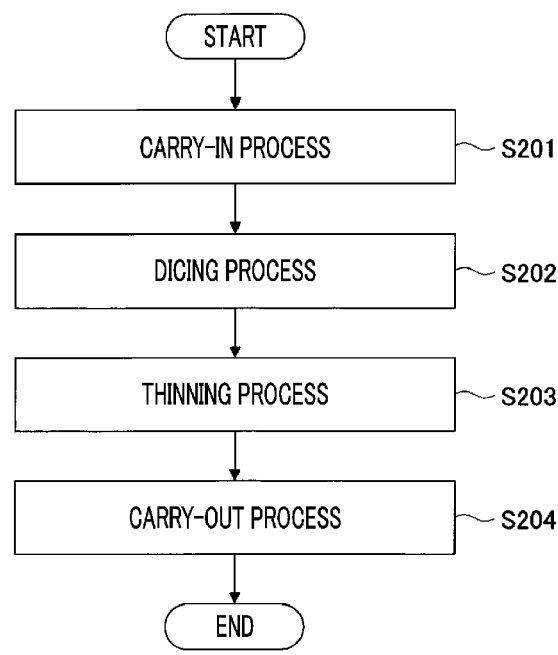
FIG. 30 is a flowchart of a substrate processing method according to the second exemplary embodiment.

Now, a substrate processing method using the substrate processing system 1D having the above-described configuration will be explained. FIG. 30 is a flowchart of the substrate processing method according to the second exemplary embodiment.

As depicted in FIG. 30, the substrate processing method includes a carry-in process S201, a dicing process S202, a thinning process S203 and a carry-out process S204. These processes are performed under the control of the controller 20. A sequence of these processes is not limited to the example shown in FIG. 30.

In the carry-in process S201, the transfer unit 58D takes out the substrate 10 from the carry-in cassette 35D placed in the placing unit 30D, and then transfers the taken substrate 10 into the dicing unit 100D.

In the dicing process S202, the dicing unit 100D performs the dicing of the substrate 10, as shown in FIG. 28. While the dicing of the substrate 10 is being performed, the first main surface 11 of the substrate 10 is protected by the protection tape 14. The substrate 10 after being diced in the dicing unit 100D is then transferred into the thinning unit 200D by the transfer unit 58D.

In the thinning process S203, the thinning unit 200D processes the second main surface 12 of the substrate 10 to thereby thin the substrate 10, as illustrated in FIG. 29. While the substrate 10 is being thinned, the first main surface 11 of the substrate 10 is protected by the protection tape 14.

In the carry-out process S204, the transfer unit 58D transfers the substrate 10 from the thinning unit 200D into the carry-out unit 40D to accommodate the substrate 10 within the carry-out cassette 45D in the carry-out unit 40D. The carry-out cassette 45D is carried to the outside from the carry-out unit 40D. The chips 13 are individually picked from the substrate 10 which is carried to the outside along with the carry-out cassette 45D, so that the chips 13 are obtained.

<Transfer Unit>

A configuration of the transfer unit 58D is the same as the configuration of the transfer unit 58 of the first exemplary embodiment except that the transfer unit 58D does not have the first holder 60 and the second holder 70 illustrated in FIG. 11, and so forth. The transfer unit 58D is equipped with a holder 80 having the same configuration as that of the third holder 80 shown in FIG. 11, and so forth.

The holder 80 is configured to hold the substrate 10 when the substrate 10 is transferred from the carry-in unit 30D into the carry-out unit 40D via the dicing unit 100D and the thinning unit 200D, for example. The holder 80 holds the substrate 10 which is mounted to the frame 19 with the protection tape 14 therebetween.

By holding the frame 19, the holder 80 holds the substrate 10 which is bonded, in an opening of the frame 19, to the protection tape 14 which is attached to the frame 19. Thus, deformation and damage of the substrate 10 after being subjected to processings such as dicing and thinning can be suppressed.

The holder 80 has a grip member 81 configured to hold the frame 19 to which the substrate 10 is mounted with the protection tape 14 therebetween; and a guide member 85 on which the frame 19 held by the grip member 81 is placed. The guide member 85 is moved along the transfer path 50D together with the grip member 81. Since the guide member 85 is not fixed, it is possible to support the frame 19 with the guide member 85 in a wide range of the transfer path 50D, and bending (deformation) of the frame 19 due to gravity can be suppressed. Thus, a deformation of the substrate 10 can be suppressed.

The transfer unit 58D is equipped with a moving mechanism configured to move the frame 19, which is held by the grip member 81, along the guide member 85 by moving the grip member 81 with respect to the guide member 85. Thus, the frame 19 can be taken out of the carry-in cassette 35D in the state that the guide member 85 is disposed at an outside of the carry-in cassette 35D. Further, the frame 19 can be accommodated into the carry-out cassette 45D in the state that the guide member 85 is disposed at an outside of the carry-out cassette 45D. In this way, since the guide member 85 is not inserted into the carry-in cassette 35D or the carry-out cassette 45D, a size of the guide member 85 in the Z direction can be designed without needing to consider an internal structure of the carry-in cassette 35D or the carry-out cassette 45D. Therefore, strength of the guide member 85 can be enhanced, so that bending (deformation) of the guide member 85 by gravity can be suppressed. As a result, the bending (deformation) of the frame 19 by the gravity can be suppressed, so that the deformation of the substrate 10 can be suppressed.

Now, an operation of the transfer unit 58D to take out the substrate 10 before being processed from the carry-in cassette 35D will be explained. Since an operation of the transfer unit 58D to accommodate the substrate 10 after being processed into the carry-out cassette 45D is the same as that of the first exemplary embodiment, redundant description thereof will be omitted.

First, the transfer unit 58D inserts the grip member 81 into the carry-in cassette 35D by moving the grip member 81 in the X direction with respect to the guide member 85 after adjusting a position of the holder 80 in the Z direction at the outside of the carry-in cassette 35D. The grip member 81 is inserted between a plurality of frames 19 arranged in the Z direction within the carry-in cassette 35D.

Then, by adjusting the position of the holder 80 in the Z direction, the transfer unit 58D places a placing surface 86 of the guide member 85, on which the frame 19 is placed, on a horizontal plane substantially level with a top surface of the accommodation plate 36D of the carry-in cassette 35D. The frame 19 may be placed on the placing surface 86 of the guide member 85 with the protection tape 14 therebetween. At this time, the transfer unit 58D holds the frame 19 with the grip member 81.

Thereafter, the transfer unit 58D takes out the grip member 81 from the inside of the carry-in cassette 35D by moving the grip member 81 in the X direction with respect to the guide member 85. Accordingly, the frame 19 is moved onto the guide member 85 from the accommodation plate 36D, so that the frame 19 and the substrate 10 are retreated from the inside of the carry-in cassette 35D.

The operation in which the transfer unit 58D delivers the substrate 10 into the carry-in cassette 35D or the carry-out cassette 45D and an operation in which the transfer unit 58D delivers the substrate 10 into each processing unit are same. Thus, description of the operation of the transfer unit 58D for delivering the substrate 10 into each processing unit will be omitted.

Though the transfer unit 58D has the single holder 80 in the present exemplary embodiment, the transfer unit 58D may have multiple holders 80. Further, these multiple holders 80 may be fastened to the same Y-axis slider 52D. With this configuration, it is possible to deliver a substrate 10 into one processing unit (for example, the dicing unit 100D) while concurrently receiving a substrate 10 from this one processing unit (for example, the dicing unit 100D).

Third Exemplary Embodiment

Figure 31A:
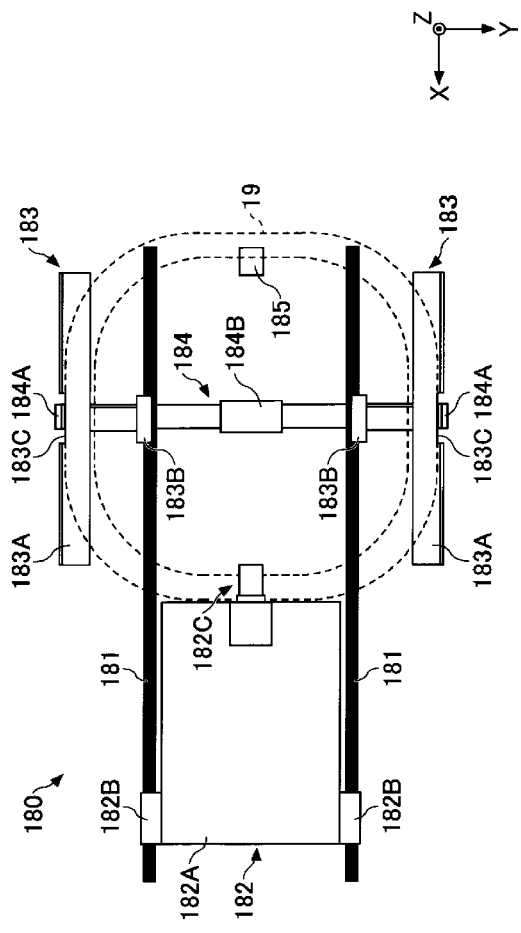
FIG. 31A and FIG. 31B are diagrams illustrating a schematic configuration of a third holder according to a third exemplary embodiment.
Figure 31B:
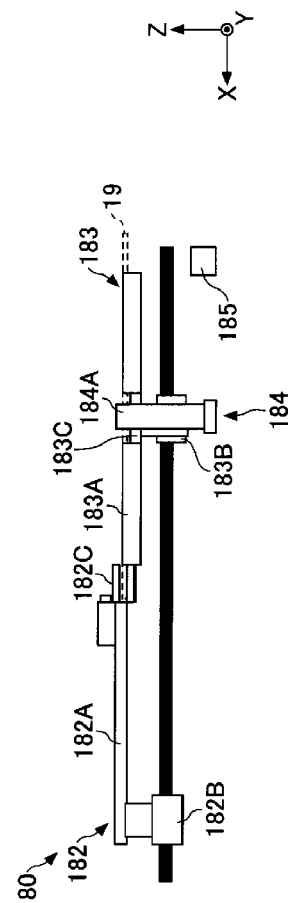
Figure 41A:
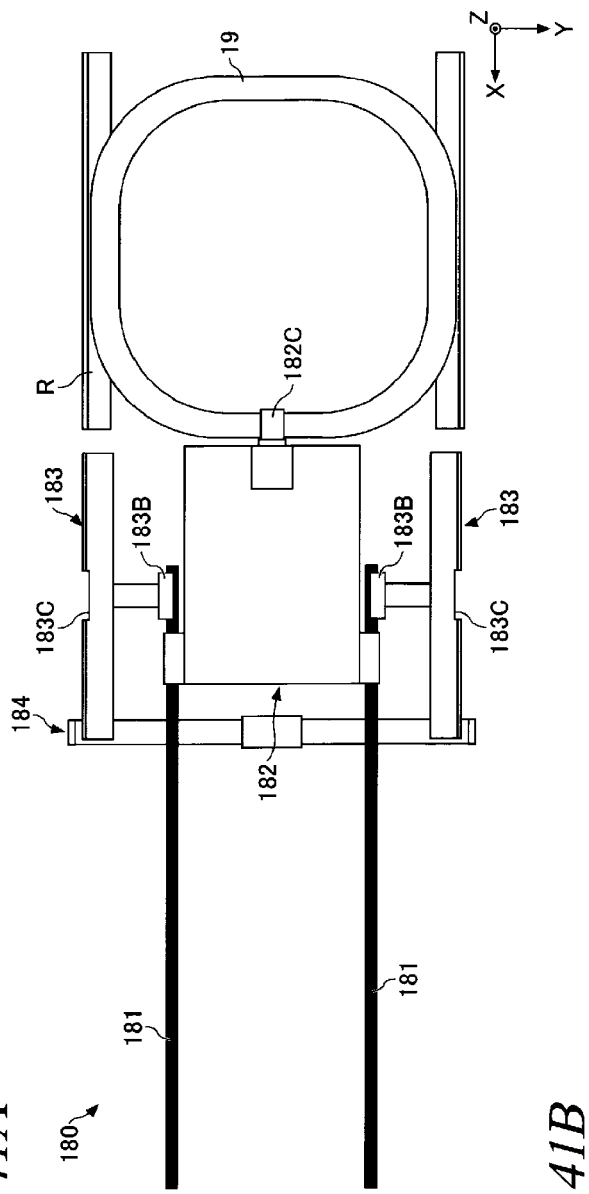
FIG. 41A and FIG. 41B are diagrams illustrating a third process of the frame handover operation by the third holder according to the third exemplary embodiment.
Figure 41B:
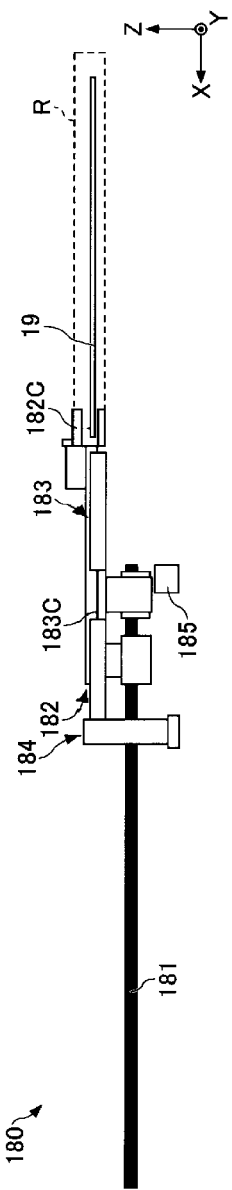

Now, a third exemplary embodiment will be explained with reference to FIG. 31A to FIG. 44G. FIG. 31A and FIG. 31B are diagrams illustrating a schematic configuration of a third holder 180 according to the third exemplary embodiment. FIG. 31A is a top view and FIG. 31B is a side view seen from the positive Y direction. The third holder 180 (grip holder) is another example of the third holder 80 of the first exemplary embodiment described above with reference to FIG. 11 and FIG. 17. A basic operation and function of the third holder 180, such as holding the frame 19, are same as those of the third holder 80.

As depicted in FIG. 31A and FIG. 31B, the third holder 180 is equipped with a pair of linear guides 181, a grip member 182, a pair of auxiliary rail members 183 (guide members), and an alignment unit 184. Further, a housing of the third holder 180 in which these components are accommodated is not illustrated here.

The linear guides 181 extend in the X direction, and are disposed in parallel to each other. The linear guides 181 are connected to the grip member 182 and the auxiliary rail members 183, and configured to move the grip member 182 and the auxiliary rail members 183 in the X direction. This pair of linear guides 181 is connected to, for example, the rotary plate 55 shown in the first exemplary embodiment.

The grip member 182 holds an end portion of the frame 19 in the X direction between the pair of linear guides 181. By being moved in the X direction along the pair of linear guides 181, the grip member 182 is capable of moving the frame 19 held by the grip member 182 in the X direction.

The grip member 182 has a base 182A, a pair of sliding members 182B and a clamp 182C. The base 182A is disposed between the pair of linear guides 181. The sliding members 182B are disposed at both ends of the base 182A in the Y direction, respectively, and connected to the pair of linear guides 181, respectively. The clamp 182C is provided at an end portion of the base 182A at the negative X direction side and is positioned at a substantially central portion thereof in the Y direction. By way of example, the clamp 182C is a pair of plate members arranged to face each other in the Z direction. By changing a distance between the pair of plate members in the Z direction, the clamp 182C is capable of switching a state in which it clamps the frame 19 and a state in which it releases the clamping of the frame 19.

The auxiliary rail members 183 are disposed at outsides of the linear guides 181, respectively. The frame 19 held by the grip member 182 is placed on the auxiliary rail members 183. Further, the auxiliary rail members 183 guide the movement of the frame 19 held by the grip member 182 along the X direction.

Each of the pair of auxiliary rail members 183 has a rail 183A extending in the X direction and a sliding member 183B connected to the linear guide 181. The rail 183A has a L-shaped cross sectional shape and comes into contact with a bottom surface of the frame 19 in the Z direction and an end surface of the frame 19 in the Y direction when the frame 19 is moved in the X direction.

The sliding member 183B is disposed at a substantially midway position of the rail 183A. Thus, when viewed from the Z direction, the auxiliary rail member 183 has a substantially T shape. The auxiliary rail members 183 are respectively connected to the linear guides 181 via the sliding members 183B, and configured to be movable in the X direction along the linear guides 181. The sliding member 183B of the auxiliary rail member 183 is connected to the linear guide 181 at a negative X direction side, as compared to the sliding member 182B of the grip member 182.

The pair of auxiliary rail members 183 is configured to be advanced to an apparatus from which the frame 19 is received when the third holder 180 receives the frame 19 with the grip member 182 or to which the frame 19 is handed over when the third holder 180 hands over the frame 19 with the grip member 182.

The alignment unit 184 holds the frame 19 from both sides thereof in a width direction (Y direction) orthogonal to a moving direction (X direction) of the frame 19, thus determining a position of the frame 19 in the width direction. The alignment unit 184 has a pair of plate-shaped members 184A disposed to face each other in the Y direction, and these plate-shaped members 184A are configured to come into contact with the end portions of the frame 19 in the Y direction. Further, the alignment unit 184 is configured such that each of the pair of plate-shaped members 184A is moved between a position (shown in FIG. 31A and FIG. 31B) where it is in contact with the end portion of the frame 19 in the Y direction and an outer position (shown in FIG. 32A and FIG. 32B) along the Y direction. The plate-shaped members 184A may be moved in the Y direction together by a driving unit 184B such as, but not limited to, a cylinder.

A notch 183C recessed in the Y direction is formed at a central portion of the rail 183A of the auxiliary rail member 183 in the X direction (near a joint of the T shape), and an upwardly standing portion of the L-shaped cross section of the rail 183A does not exists in the corresponding portion. By being moved in the notch 183C of the auxiliary rail member 183 to an innermost position in the Y direction, the plate-shaped member 184A of the alignment unit 184 can be brought into contact with the frame 19 which is placed in the auxiliary rail members 183.

Further, as the plate-shaped member 184A of the alignment unit 184 is moved to the outer position in the Y direction, the plate-shaped member 184A does not overlap with the rail 183A of the auxiliary rail member 183 in the X direction. Thus, the auxiliary rail member 183 can be moved in the X direction.

Further, the third holder 180 is equipped with a sensor 185 configured to detect presence or absence of the frame 19. The sensor 185 is provided at an end portion of the third holder 180 at the negative X direction side to be located at a midway position between the pair of linear guides 181. When the frame 19 exists directly above the sensor 185, that is, when the frame 19 is normally placed at a preset position of the third holder 180, the sensor 185 is capable of detecting the presence of the frame 19.

The third holder 180 has the same driving system as that of the transfer unit 58 of the first exemplary embodiment as a driving source for the movements of the grip member 182 and the auxiliary rail members 183 in the X direction.

Now, referring to FIG. 32A to FIG. 38B, a receiving operation in which the third holder 180 of the third exemplary embodiment receives the frame 19 will be explained. FIG. 32A to FIG. 38B are diagrams illustrating first to seventh processes of the receiving operation of receiving the frame 19 by the third holder 180 according to the third exemplary embodiment. In FIG. 32A to FIG. 38B and, also, in FIG. 39A to FIG. 41B to be described later, a rail R of a target object (the mounting unit 500 or the thinning unit 600) from which the third holder 180 receives the frame 19 and the frame 19 placed on this rail R are also illustrated in addition to the third holder 180 shown in FIG. 31A and FIG. 31B. Further, in each of FIG. 32B, FIG. 33B, FIG. 34B, FIG. 35B, FIG. 36B, FIG. 37B, FIG. 38B, FIG. 39B, FIG. 40B and FIG. 41B, the rail R is indicated by a dashed line.

At an initial position of the third holder 180 shown in FIG. 32A and FIG. 32B, the grip member 182 is placed at an innermost position from the rail R of the target object, and the clamp 182C is in the open state. The auxiliary rail member 183 is located at a position where the sliding member 183B is overlapped with the alignment unit 184. The plate-shaped member 184A of the alignment unit 184 is located at a position of the notch 183C of the rail 183A, and is opened to an outside in the Y direction. In FIG. 32A and FIG. 32B, to receive the frame 19 placed on the rail R of the target object, the third holder 180 is placed at a position where an extension direction of the auxiliary rail member 183 overlaps with an extension direction of the rail R of the target object.

First, the auxiliary rail member 183 is advanced to the negative X direction side, and an end portion of the rail 183A at the negative X direction side faces an end portion of the rail R of the target object at a positive X direction side (see FIG. 33A and FIG. 33B). At this time, the rail 183A and the rail R need not come into contact with each other as long as a distance therebetween is set to allow the frame 19 to be moved smoothly between the rail 183A and the rail R.

Then, the grip member 182 is advanced toward the negative X direction side, and the end portion of the frame 19 enters the clamp 182C in the open state. Then, the clamp 182C is turned into the closed state, so that the frame 19 is clamped by the clamp 182C (see FIG. 34A and FIG. 34B). In this operation, the clamp 182C may be turned into the closed state after a lower plate member of the clamp 182C is brought into contact with a lower portion of the frame 19 by raising the clamp 182C in the state that the end portion of the frame 19 enters the clamp 182C in the open state.

Subsequently, the grip member 182 is retreated to a rear end at the positive X direction side while holding the frame 19 (see FIG. 35A and FIG. 35B). Accordingly, the frame 19 is moved to the positive X direction side and moved onto the auxiliary rail 183 from the rail R. Thereafter, the auxiliary rail 183 is retreated to the initial position (see FIG. 36A and FIG. 36B).

Then, the clamp 182C of the grip member 182 is turned into the open state. Accordingly, the frame 19 is not clamped by the clamp 182C, and is just placed on the clamp 182C and the auxiliary rail member 183. In this state, the grip member 182 is moved to the negative X direction side by a preset amount (see FIG. 37A and FIG. 37B). Accordingly, the end portion of the frame 19 is pressed at the end surface of the clamp 182C at the positive X direction side and is moved to the negative X direction side, so that the frame 19 is set to a preset standby position in the X direction. At this time, since the end portion of the frame 19 at the positive X direction side is located directly above the sensor 185, the sensor 185 is capable of detecting the frame 19.

Then, the alignment unit 184 is moved toward the frame 19 and holds the frame 19 from both sides in the Y direction, so that the frame 19 is set to a preset standby position in the Y direction. Further, the clamp 182C is turned into the closed state to clamp the frame 19 (FIG. 38A and FIG. 38B), and the receiving operation is ended.

Now, referring to FIG. 39A to FIG. 41B and FIG. 32A to FIG. 33B, a hand-over operation of handing over the frame 19 by the third holder 180 according to the third exemplary embodiment will be explained. FIG. 39A to FIG. 41B are diagrams illustrating first to third processes of the hand-over operation of handing over the frame 19 by the third holder 180 of the third exemplary embodiment. A fourth process and a fifth process of the hand-over operation are the same as the states shown in FIG. 33A and FIG. 33B and FIG. 32A and FIG. 32B, respectively, the fourth and fifth processes will be described with reference to these drawings.

From the state in which the third holder 180 holds the frame 19 at the standby position as illustrated in FIG. 38A and FIG. 38B, the alignment unit 184 is opened to the outside in the Y direction, and the auxiliary rail member 183 is advanced toward the negative X direction. Accordingly, the end portion of the rail 183A at the negative X direction side faces the end portion of the rail R of the target object at the positive X direction side (FIG. 39A and FIG. 39B).

Subsequently, the clamp 182C of the grip member 182 is turned into the open state, and the grip member 182 is advanced toward the negative X direction side (FIG. 40A and FIG. 40B). Accordingly, the end portion of the frame 19 is pressed by the end surface of the clamp 182C at the positive X direction side, so that the frame 19 is moved toward the negative X direction side and moved from the auxiliary rail member 183 onto the rail R of the target object. That is, the frame 19 is set on a preset position of the rail R.

Then, in the state that the clamp 182C of the grip member 182 is moved down and distanced away from the frame 19 (FIG. 41A and FIG. 41B), the grip member 182 is retreated to the initial position at the positive X direction side (FIG. 33A and FIG. 33B). Then, the auxiliary rail member 183 is retreated to the initial position (FIG. 32A and FIG. 32B), and the handover operation is ended.

As stated above, in the third exemplary embodiment, the third holder 180 is equipped with the alignment unit 184 and performs the positioning of the frame 19 in the width direction by holding the frame 19, which is moved to the standby position for the transfer by the grip member 182, from both sides of the frame in the width direction (Y direction). Thus, positioning of the frame 19, which is held by the third holder 180, can be carried out accurately in the X direction and the Y direction. Therefore, when handing over the frame 19 to the target object from the third holder 180 in a subsequent processing, positioning of the frame 19 with respect to the target object is eased, so that the transfer of the frame 19 can be carried out more accurately.

Further, in the third exemplary embodiment, the third holder 180 is equipped with the auxiliary rail members 183. The auxiliary rail members 183 are configured to be advanced toward the rail R of the target object from which the frame 19 is received when the third holder 180 receives the frame 19 with the grip member 182 or to which the frame 19 is handed over when the third holder 180 hands over the frame 19 with the grip member 182. With this configuration, the auxiliary rail members 183 can be accommodated without being protruded from the third holder 180 except when the frame 19 is received or handed over. Thus, a space can be saved, and a turning radius of the third holder 180 can be secured.

Furthermore, in the present exemplary embodiment, the sensor 185 for detecting whether the frame 19 is placed at the preset standby position is provided at the midway position between the pair of linear guides 181 at the end portion of the third holder 180 at the negative X direction side. However, the location of the sensor 185 may not be limited thereto. By way of example, the sensor 185 may be placed at a contact portion between the auxiliary rail member 183 and frame 19 or a contact portion between the alignment unit 184 and the frame 19, or placed at the clamp 182C.

Fourth Exemplary Embodiment

Figure 42A:
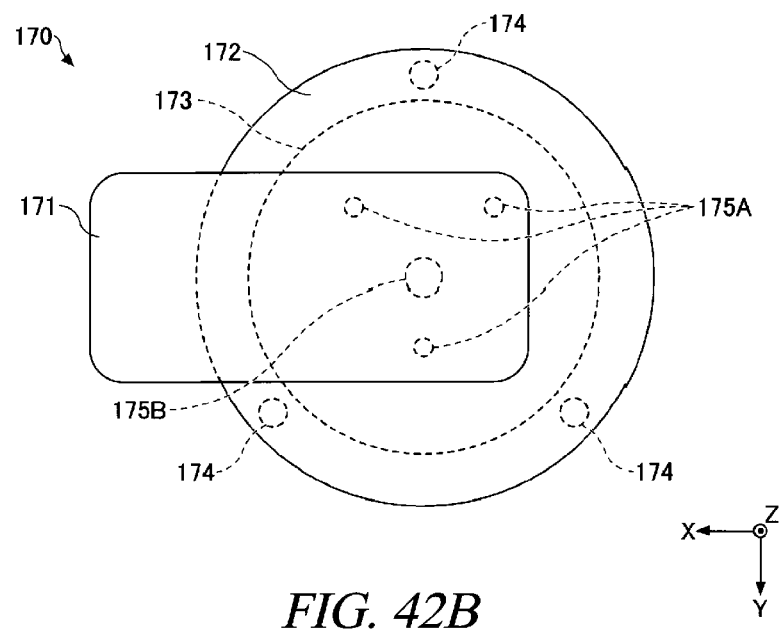
FIG. 42A and FIG. 42B are plan views illustrating a schematic configuration of a second holder according to a fourth exemplary embodiment.
Figure 42B:
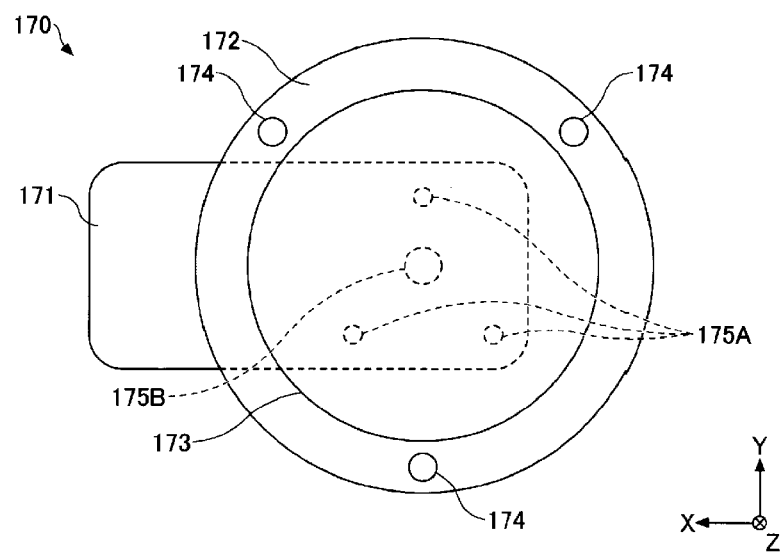

Now, referring to FIG. 42A to FIG. 44G, a fourth exemplary embodiment will be described. FIG. 42A and FIG. 42B are plan views illustrating a schematic configuration of a second holder 170 according to the fourth exemplary embodiment. FIG. 42A is a top view and FIG. 42B is a bottom view. The second holder 170 (attracting/holding unit) is another example of the second holder 70 of the first exemplary embodiment described in FIG. 11 and FIG. 13. A basic operation and function of the second holder 170 such as holding the substrate 10 by attraction are the same as those of the second holder 70.

The second holder 170 is equipped with an arm 171, an intermediate disk 172, a porous pad 173, alignment pins 174, suspension mechanism 175A and a suspension mechanism 175B.

The arm 171 moves the second holder 170 in the X, Y and Z directions by a transfer device such as the transfer unit 58.

The intermediate disk 172 is connected to a bottom portion of the arm 171. The intermediate disk 172 is a circular plate-shaped member having a diameter larger than that of the porous pad 173. The intermediate disk 172 is arranged to be concentric with the porous pad 173. The intermediate disk 172 is made of, for example, a metal.

The porous pad 173 is connected to a bottom portion of the intermediate disk 172. The porous pad 173 is a device capable of attracting and holding the substrate 10 by an attracting surface at a bottom portion thereof. Like the second holder 70 of the first exemplary embodiment, the porous pad 173 includes a disc-shaped porous body 72; a disk 73 having, on a surface in contact with the porous body 72, suction grooves formed in concentric circles and suction grooves formed in a radial shape; and a base 74 accommodating the porous body 72 and the disk 73.

The alignment pins 174 are protruded from a bottom surface of the intermediate disk 172 in a vertical direction. The alignment pins 174 are arranged at a regular distance therebetween in a circumferential direction to be respectively located at positions outer than the porous pad 173. Lengths of the alignment pins 174 in the Z direction are uniform. The alignment pins 174 are formed such that leading ends thereof are protruded below a bottom surface of the porous pad 173 when the third holder 180 is in a no-load state without being contact with another member (see FIG. 43A or the like).

The suspension mechanisms 175A (first suspension mechanisms) connect the arm 171 and the intermediate disk 172. Each suspension mechanisms 175A is configured to allow the intermediate disk 172 to be suspended from the arm 171 by an elastic member such as a spring, and a movement of the suspension mechanism 175A except that in the Z direction is restricted. Accordingly, when an external force is applied from above or below, the suspension mechanism 175A is appropriately contracted or extended to shorten or increase a distance between the members. The suspension mechanisms 175A are arranged at a regular distance along the circumferential direction to be respectively placed at positions substantially equally spaced from a center of the circular intermediate disk 172 in a radial direction, as illustrated in FIG. 42A and FIG. 42B. Further, though three suspension mechanisms 175A are provided in the configuration shown in FIG. 42A and FIG. 42B, the number of the suspension mechanisms 175A is not limited thereto.

The suspension mechanism 175B (second suspension mechanism) connects the arm 171 and the porous pad 173 (see FIG. 43A or the like). The suspension mechanism 175B has a pin 175B1 configured to connect the arm 171 and the porous pad 173; and an elastic body 175B2 disposed between the arm 171 and the intermediate disk 172.

The intermediate disk 172 is provided with a hole at a position where the pin 175B1 is disposed when viewed from the Z direction, and a sleeve 172A made of a resin is formed at an inner surface of this hole. In the state that the pin 175B1 penetrates the sleeve 172A, the pin 175B1 allows the porous pad 173 to be suspended from the arm 171. The pin 175B1 is made of a material, such as a metal, which is not elastically transformed in the Z direction. Further, the intermediate disk 172 is also made of, for example, a metal. Since the pin 175B1 is inserted through the sleeve 172A, abrasion (wear) of the pin 175B1 and the intermediate disk 172 due to a direct contact therebetween can be suppressed.

The elastic body 175B2 is disposed around the pin 175B1. By providing the elastic body 175B2, shaking or vibration of the pin 175B1 and the porous pad 173 with respect to the arm 171 can be reduced.

Further, although FIG. 42A and FIG. 42B illustrates a configuration in which only one suspension mechanism 175B is provided at a central position of the circular porous pad 173, the layout and the number of the suspension mechanism 175B are not limited thereto. Further, the sleeve 172A made of the resin may not be provided, and the pin 175B1 of the suspension mechanism 175B may be inserted in the hole of the intermediate disk 172 made of the metal. Furthermore, the suspension mechanism 175B may not have the elastic body 175B2.

The suspension mechanisms 175A and the elastic body 175B2 of the suspension mechanism 175B may be, by way of example, spring type cylinders or air cylinders. Further, in the present exemplary embodiment, the suspension mechanisms 175A and the elastic body 175B2 of the suspension mechanism 175B are schematically illustrated as spherical shapes as illustrated in FIG. 43A or the like, and transformation of these spherical shapes indicate contraction or extension of the suspension mechanisms 175A and the elastic body 175B2 of the suspension mechanism 175B, as illustrated in FIG. 43C.

Referring to FIG. 43A to FIG. 43G, a receiving operation in which the second holder 170 of the fourth exemplary embodiment receives the substrate 10 will be explained. FIG. 43A to FIG. 43G are diagrams illustrating individual processes of the receiving operation in which the second holder 170 of the fourth exemplary embodiment receives the substrate 10. FIG. 43A to FIG. 43G depict the second holder 170 of the fourth exemplary embodiment of FIG. 42A and FIG. 42B, seen from the side, and illustrate an example configuration where the second holder 170 receives a substrate 10 placed on an attracting device C of a target object (the dicing unit 100, the thinning unit 200, the ultraviolet irradiating unit 400, the mounting unit 500, or the like) which is disposed under the second holder 170.

As shown in FIG. 43A, the substrate 10 placed on the attracting device C is attracted downwards by the attracting device C. The second holder 170 descends from above the substrate 10 to approach the substrate 10 while generating an attracting force in an upward direction by operating the porous pad 173.

First, the alignment pins 174 collide with a top surface of the attracting device C (FIG. 43B), so that the descent of the intermediate disk 172 is restricted. At this time, as all the alignment pins 174 collide with the top surface of the attracting device C, the intermediate disk 172 is adjusted to be parallel to the attracting device C by the suspension mechanisms 175A.

As the arm 171 is moved downwards from this state, the suspension mechanisms 175A and the elastic body 175B2 of the suspension mechanism 175B are contracted. Accordingly, the pin 175B1 of the suspension mechanism 175B advances down below the intermediate disk 172, so that the porous pad 173 is moved down and comes into surface contact with the substrate 10 (FIG. 43C).

Subsequently, while maintaining the contact state between the porous pad 173 and the substrate 10, the attraction by the attracting device C of the target object in the downward direction is stopped (FIG. 43D), and purge in an upward direction by the attracting device C is begun (FIG. 43E).

Then, if the arm 171 is begun to be moved upwards, the contractions of the suspension mechanism 175A and the elastic body 175B2 of the suspension mechanism 175B are released, and the porous pad 173 is raised to an initial position in the state where it attracts the substrate 10 (FIG. 43F). Further, if the arm 171 is raised, the alignment pins 174 are distanced apart from the top surface of the attracting device C (FIG. 43G), and the receiving operation for the substrate 10 is ended.

Now, referring to FIG. 44A to FIG. 44G, a handover operation in which the second holder 170 according to the fourth exemplary embodiment hands over the substrate 10 will be explained. FIG. 44A to FIG. 44G are diagrams illustrating individual processes of the handover operation in which the second holder 170 according to the fourth exemplary embodiment hands over the substrate 10. FIG. 44A to FIG. 44G depict the second holder 170 of the fourth exemplary embodiment of FIG. 42A and FIG. 42B, seen from the side, and illustrate an example configuration where the second holder 170 hands over the substrate 10, which is held by the porous pad 173, onto the top surface of the attracting device C of the target object disposed under the second holder 170.

As depicted in FIG. 44A, the attracting device C is generating an attracting force in a downward direction. The second holder 170 descends from above the attracting device C and approaches the top surface of the attracting device C while attracting the substrate 10 by the porous pad 173.

First, the alignment pins 174 collide with the top surface of the attracting device C (FIG. 44B), so that the descent of the intermediate disk 172 is restricted. At this time, as all the alignment pins 174 collide with the top surface of the attracting device C, the intermediate disk 172 is adjusted to be parallel to the attracting device C by the suspension mechanisms 175A.

As the arm 171 is moved downwards from this state, the suspension mechanisms 175A and the elastic body 175B2 of the suspension mechanism 175B are contracted. Accordingly, the pin 175B1 of the suspension mechanism 175B advances down below the intermediate disk 172, so that the porous pad 173 and the substrate 10 are moved down, and the substrate 10 comes into surface contact with the top surface of the attracting device C (FIG. 44C).

Subsequently, while maintaining the contact state between the attracting device C and the substrate 10, the attraction by the porous pad 173 in the upward direction is stopped (FIG. 44D), and purge in the downward direction by the porous pad 173 is begun (FIG. 44E).

Then, if the arm 171 is begun to be moved upwards, the contractions of the suspension mechanisms 175A and the elastic body 175B2 of the suspension mechanism 175B are released, and the porous pad 173 is distanced away from the substrate 10 and raised to the initial position (FIG. 44F). Further, if the arm 171 is raised, the alignment pins 174 are distanced apart from the top surface of the attracting device C (FIG. 44G), and the handover operation for the substrate 10 is ended.

In the fourth exemplary embodiment, the alignment pins 174 are configured to protrude downwards below the attracting surface at the bottom portion of the porous pad 173 when they are in the no-load state. Thus, attracting surface can be adjusted to face the target object in parallel accurately before the porous pad 173 comes into contact with the target object. Further, by providing the intermediate disk 172 between the arm 171 and the porous pad 173 and providing the suspension mechanisms 175A and 175B between these respective members, a force from the arm 171 can be completely delivered to the entire surface of the porous pad 173 via the suspension mechanisms 175A and 175B in the state that the porous pad 173 and the attracting device C are aligned to be parallel to each other. Accordingly, the contact at the attracting surface can be further enhanced. Therefore, the attraction of the substrate 10 to the porous pad 173 and the handover of the substrate 10 from the porous pad 173 can be carried out more stably.

Further, if a descending distance (length) of the arm 171 after the alignment pins 174 come into contact (collide) with the attracting device C is varied depending on a thickness of the substrate 10, the attraction of the substrate 10 to the porous pad 173 and the handover of the substrate 10 from the porous pad 173 can be carried out even more stably.

CHANGES AND MODIFICATIONS

So far, the exemplary embodiments of the transfer device, the substrate processing system, the transfer method and the substrate processing method have been described. However, the present disclosure is not limited to the above-described exemplary embodiments, and various changes and modifications may be made without departing from the scope of the present disclosure as claimed in the claims.

This international application claims priority to Japanese Patent Application No. 2017-136322, field on Jul. 12, 2017 and Japanese Patent Application No. 2018-007669, field on Jan. 19, 2018, which applications are hereby incorporated by reference in their entirety.

According to the exemplary embodiment, it is possible to provide the transfer device capable of suppressing bending of the frame that might be caused by gravity, and thus capable of suppressing deformation of the substrate mounted to the frame with the tape therebetween.

We claim:
1. A transfer device, comprising:
   a grip member configured to hold a frame to which the substrate is mounted with a tape therebetween;
   a guide member configured to place thereon the frame held by the grip member;
   a moving mechanism configured to move the grip member with respect to the guide member to move the frame held by the grip member along the guide member,
   a grip holder comprising the grip member and the guide member; and an attracting/holding unit configured to attract and hold the substrate,
wherein the attracting/holding unit comprises:
an arm configured to be moved in multiple directions;
an intermediate disk connected to a bottom portion of the arm;
a porous pad connected to a bottom portion of the intermediate disk;
alignment pins protruded downwards from the intermediate disk;
a first suspension mechanism provided between the arm and the intermediate disk and configured to allow the intermediate disk to be suspended from the arm by an elastic member; and
a second suspension mechanism configured to connect the arm and the porous pad, and
wherein the alignment pins are protruded downwards below an attracting surface of a bottom surface of the porous pad when the alignment pins are in a no-load state.

2. A substrate processing system equipped with a transfer device comprising a grip member configured to hold a frame to which the substrate is mounted with a tape therebetween; a guide member configured to place thereon the frame held by the grip member; a moving mechanism configured to move the grip member with respect to the guide member to move the frame held by the grip member along the guide member, the substrate processing system comprising:
a carry-in unit into which a carry-in cassette, which accommodates therein the substrate before being thinned and before being mounted to the frame with the tape therebetween, is carried in;
a thinning unit configured to thin the substrate taken out from the carry-in cassette in the carry-in unit;
a mounting unit configured to mount the substrate, which is thinned by the thinning unit, to the frame with the tape therebetween;
a carry-out unit from which a carry-out cassette, which accommodates therein the substrate after being thinned and after being mounted by the mounting unit to the frame with the tape therebetween, is carried out; and
a controller configured to control the transfer device to accommodate the frame, to which the substrate is mounted with the tape therebetween, into the carry-out cassette placed in the carry-out unit.

3. The substrate processing system of claim 2,
wherein the guide member is configured to be advanced toward a target object from which the frame is received when the frame is received by the grip member or to which the frame is handed over when the frame is handed over by the grip member.

4. The substrate processing system of claim 2, further comprising:
an alignment unit configured to hold the frame, which is moved by the grip member to a standby position for a transfer, from both sides thereof in a width direction perpendicular to a moving direction of the frame, to perform position-alignment of the frame in the width direction.

5. The substrate processing system of claim 2,
wherein the carry-in unit, the thinning unit, the mounting unit and the carry-out unit are provided adjacent to the transfer path, and
the transfer device transfers the substrate from the carry-in unit into the carry-out unit via the thinning unit and the mounting unit.

6. The substrate processing system of claim 2, further comprising:
a transfer unit configured to transfer the substrate before being mounted to the frame.

7. A substrate processing method by using the transfer method comprising holding a frame, to which the substrate is mounted with a tape therebetween, by a grip member belonging to the transfer device, and placing the frame on a guide member belonging to the transfer device; and moving the grip member with respect to the guide member to move the frame, which is held by the grip member, along the guide member, the substrate processing method comprising:
taking out, from a carry-in cassette placed in a carry-in unit, the substrate before being thinned and before being mounted to the frame with the tape therebetween;
thinning, in a thinning unit, the substrate taken out from the carry-in cassette;
mounting, in a mounting unit, the substrate thinned by the thinning unit to the frame with the tape therebetween; and
accommodating the substrate, after being thinned and after being mounted by the mounting unit to the frame with the tape therebetween, into a carry-out cassette placed in a carry-out unit,
wherein the transfer method is performed when the substrate is accommodated into the carry-out cassette.

8. The substrate processing method of claim 7,
wherein the guide member belonging to the transfer device is advanced toward a target object from which the frame is received when the frame is received by the grip member or to which the frame is handed over when the frame is handed over by the grip member.

9. The substrate processing method of claim 7,
wherein in an alignment unit belonging to the transfer device, the frame, which is moved by the grip member to a standby position for a transfer, is held from both sides thereof in a width direction perpendicular to a moving direction of the frame to perform position-alignment of the frame in the width direction.

10. The substrate processing method of claim 7,
wherein the substrate is transferred into the carry-out unit from the carry-in unit via the thinning unit and the mounting unit by moving the transfer device along the transfer path around which the carry-in unit, the thinning unit, the mounting unit and the carry-out unit are disposed.

* * * * *